US012671008B2

(12) United States Patent
Estruga Ortiga et al.

(10) Patent No.: US 12,671,008 B2
(45) Date of Patent: Jun. 30, 2026

(54) ELECTRICALLY CONDUCTIVE ONE COMPONENT (1K) EPOXY FORMULATION

(71) Applicant: Henkel AG & Co. KGaA, Duesseldorf (DE)

(72) Inventors: Marc Estruga Ortiga, Hasselt (BE); Anja Henckens, Zonhoven (BE)

(73) Assignee: Henkel AG & Co. KGaA, Duesseldorf (DE)

(*) Notice: Subject to any disclaimer, the term of this patent is extended or adjusted under 35 U.S.C. 154(b) by 18 days.

(21) Appl. No.: 18/114,815

(22) Filed: Feb. 27, 2023

(65) Prior Publication Data

US 2023/0386698 A1 Nov. 30, 2023

Related U.S. Application Data

(63) Continuation of application No. PCT/EP2021/072946, filed on Aug. 18, 2021.

(30) Foreign Application Priority Data

Aug. 27, 2020 (EP) .................................... 20193140

(51) Int. Cl.
*H01B 1/22* (2006.01)
*C09J 9/02* (2006.01)
(Continued)

(52) U.S. Cl.
CPC ............ *H01B 1/22* (2013.01); *H10F 19/906* (2025.01); *C09J 9/02* (2013.01); *C09J 163/00* (2013.01); *C09J 2203/322* (2013.01); *H01B 1/24* (2013.01)

(58) Field of Classification Search
CPC . H01L 31/05–0516; C09J 9/02; C09J 163/00; H01B 1/22; H10F 19/906
See application file for complete search history.

(56) References Cited

U.S. PATENT DOCUMENTS 6,344,157 B1 2/2002 Cheng et al.
7,108,806 B2 9/2006 Yue et al.
(Continued)

FOREIGN PATENT DOCUMENTS

CN 110894411 B 9/2021
EP 1715004 A1 10/2006
(Continued)

OTHER PUBLICATIONS

PCT International Search Report issued in connection with International Application No. PCT/EP2021/072946—Mailing date: Jan. 26, 2022.

*Primary Examiner* — Lindsey A Buck
(74) *Attorney, Agent, or Firm* — Steven C. Bauman

(57) ABSTRACT

The present invention is directed to an electrically conductive composition comprising: a) a resin component comprising: 1) a first epoxy resin; and, 2) a second epoxy resin and/or a functionalised polybutadiene resin and/or a functionalised butadiene-acrylonitrile copolymer; b) a curative for epoxy resin; c) an electrically conductive filler; d) a one core shell rubber toughener; and, e) a reactive diluent component comprising 1) a monofunctional epoxy diluent and/or 2) a polyfunctional epoxy diluent; wherein said composition further comprises a curing agent if said functionalised polybutadiene resin is present in said resin component.

15 Claims, 2 Drawing Sheets

1a

1b

(51) Int. Cl.

| | |
|---|---|
| ***C09J 163/00*** | (2006.01) |
| ***H01B 1/24*** | (2006.01) |
| ***H10F 19/90*** | (2025.01) |

(56) References Cited

U.S. PATENT DOCUMENTS

| | | | | |
|---|---|---|---|---|
| 7,326,369 | B2 | 2/2008 | Cheng | |
| 9,070,488 | B2 | 6/2015 | Ikada et al. | |
| 10,233,324 | B2 | 3/2019 | Harada et al. | |
| 2009/0186975 | A1* | 7/2009 | Schaal | H01B 3/40 524/437 |
| 2010/0209690 | A1 | 8/2010 | Sang | |
| 2012/0095133 | A1* | 4/2012 | Vyakaranam | C09D 163/00 523/435 |
| 2012/0177930 | A1* | 7/2012 | Henckens | C09J 9/02 977/773 |
| 2014/0124014 | A1* | 5/2014 | Morad | H01L 31/042 136/246 |
| 2017/0210951 | A1* | 7/2017 | Abe | C09J 163/04 |
| 2017/0247550 | A1* | 8/2017 | Umeda | C08G 59/56 |
| 2018/0022647 | A1* | 1/2018 | Teichert | B05D 3/007 427/355 |

FOREIGN PATENT DOCUMENTS

| | | | |
|---|---|---|---|
| EP | 3150680 | A1 | 4/2017 |
| EP | 3401928 | A1 | 11/2018 |
| JP | 2012532942 | A | 12/2012 |
| JP | 2015224329 | A | 12/2015 |
| JP | 2016508077 | A | 3/2016 |
| TW | 201406853 | A | 2/2014 |
| TW | 201508023 | A | 3/2015 |
| TW | 201606044 | A | 2/2016 |
| TW | 201611701 | A | 3/2016 |
| TW | 201900813 | A | 1/2019 |
| WO | 2010093598 | A2 | 8/2010 |
| WO | 2011003948 | A2 | 1/2011 |
| WO | 2013047147 | A1 | 4/2013 |
| WO | 2014088866 | A1 | 6/2014 |
| WO | 2019206417 | A1 | 10/2019 |

* cited by examiner

ELECTRICALLY CONDUCTIVE ONE COMPONENT (1K) EPOXY FORMULATION

TECHNICAL FIELD

The present invention relates to an electrically conductive, one-component (1K) epoxy adhesive composition, said composition comprising electrically conductive particles, core-shell rubber particles, at least one epoxy resin and at least one epoxy functional reactive diluent. The electrically conductive adhesive composition has particular utility in attaching solar cells together in a shingled photovoltaic module.

TECHNICAL BACKGROUND

A solar cell or a photovoltaic cell is an electrical device that converts the energy of light directly into electricity by the photovoltaic effect. Solar cells are the building blocks of photovoltaic modules, otherwise known as solar panels.

As illustrated in FIG. 1 appended hereto, most of the solar cells (1) produced today consist of crystalline silicon wafers on which metallic contacts—busbars (2) and fingers (3)—are both printed, which contacts serve to collect the current generated by the cell. For illustrative purposes only, FIG. 1*a* illustrates a basic solar cell configuration with three busbars (2) and FIG. 1*b* illustrates a basic solar cell configuration with four busbars (2).

The array of straight, parallel and equally spaced thin fingers (3) covers a small portion of the light receiving surface of each individual silicon solar cell (1). These finger lines (3) reduce the resistance to the photoelectric current and provide lower current losses. Further, the finger lines (3) collect the current from the silicon solar cell surface and transfer it to tabbing ribbons (5)—as illustrated in FIG. 2 appended hereto—through the busbars (2), which busbars are electric current conducting lines. The busbars (2) are disposed parallel to each other, are equally spaced and are orthogonal to the finger lines (3) array. The tabbing ribbon (5) is soldered to the surface of the busbars and facilitates transfer of the electric current from the connected silicon solar cells onwards to another silicon solar cell, to an accumulator or to a solar inverter.

Both busbars (2) and finger lines (3) are conventionally comprised of either high-temperature firing pastes or low temperature, non-firing type pastes—for heat sensitive solar cells, such as heterojunction (HJT or HIT) or tandem (perovskite-based) solar cells—and are usually realized by a one or two-stage printing process, which lays down these metallic contacts across and along the solar cell: the use of two successive printing stages facilitates the use of different materials for the busbars and finger lines respectively and also reflects the need to print busbars at a width thinner than finger lines. When printing the front side grid in two successive stages, typically, the finger lines (3) are printed and dried first and the busbars (2) are printed over the finger lines. While a single print step would result in similar heights of the busbar and the finger lines, in two-stage printing, in order to have secured contact between the finger lines and the busbars, and due to possible miss-alignment between the two patterns, there is a need for an overlap between the two patterns. In the overlap areas of the finger lines and busbars the height will be different than in the area where finger lines or busbars only are printed.

When the ribbons (5) are attached to the busbars (2) by means of a soldering process, those ribbons (5) are thus disposed on top of the busbars and—where disposed on the front of solar cells—cause a shadow area to extend over the solar cell: this shadow, concomitantly with the surface area of the solar cell actually covered by the busbars themselves, leads to a decrease in the efficiency of the photovoltaic module.

Further problems associated with such solar cell structures include: resistive losses resultant from a high current passing through ribbons (5) of small cross-section; differential thermal contraction of the ribbons (5) and the silicon wafer which can result in high stress in the metallization and silicon; and, stress and micro-cracks in the silicon wafer caused by the local effects of heat and pressure in the soldering process, which effects stymie the development of thinner wafers.

As a consequence of these problems, new solar module concepts have been developed which make use of new interconnection technologies and new solar cell types: by way of example, note may be made of multiwire interconnection on busbarless cells and conductive backsheet interconnection with back-contact cells. The present invention is however more particularly concerned both with the use of conductive adhesives in place of soldering and with series connected cells module structures, especially with shingled cells module structures.

In the shingled cells module structure shown FIG. 3, solar strips are presented which are rectangular or substantially rectangular in shape. The long side usually has a length corresponding to the side length of a standard solar wafer—historically 156 mm but presently increasing in size, even up to 210 mm—and the short side has a length of only a few centimetres. Such solar cell strips have been cut out or diced from a processed device of standard size—such as, but not limited to, a 156 mm×156 mm device—with due care taken to avoid cracks and like structural failures during the cutting or dicing process. The cells have busbars or rows of interconnection pads along the long edge, one on the front and one on the back. To create a cells string, an interconnection material is applied to connect the rear busbar of a cell with the front busbar of the next cell. The cells overlap each other slightly, so that the front busbars are covered by the edge region of the adjacent cell, just like shingles on a roof. Given that: i) there is no spacing between cells as compared to conventional modules; ii) the cell area that is shaded by the front busbar is covered by an active area of another cell; and, iii) there is no ribbon covering the cells' front surface to cause shading, this shingle structure results in modules with an extremely high active area to total area ratio, allowing in principle very high module efficiency.

The adjacent cells in a given string are bonded to each other at the overlapping portions of the solar cells with an electrically conductive material (4) which can be deposited in different patterns. Electrically conductive adhesive (ECA) as a material to bond the solar cells together presents the advantage that the adhesives overcome mechanical stresses which build up due to coefficient of thermal expansion (CTE) mismatches between the different materials used in a photovoltaic assembly.

Electrically conductive adhesives (ECA) are highly filled materials, typically characterized by having at least 40 wt. % and most of the time greater than 60 wt. % or even 80 wt. % of conductive filler particles, as required to ensure multiple percolation paths and provide good electrical conductivity and low contact resistance. Unfortunately, conductive filler particles do not provide reinforcing properties and do not contribute to material cohesion. As a result, an electrically conductive adhesive's intrinsic mechanical strength is much poorer than the same materials without filler.

The need for the polymer matrix to provide adequate shear strength is a first parameter which is determinative in the selection of an appropriate adhesive. Shear modulus (G, MPa) or storage modulus (E, MPa) is a further determinant: within a shingled interconnection, the solar cells movement is much more constrained and the joints between the cells have to allow some movement by deformation while bearing some stress. Silicone electrically conductive adhesives are conventionally flexible (low G, low E) but usually have lower shear strength. Epoxy-based electrically conductive adhesives, conversely, show a high shear strength but tend to be rather stiff (high G, high E) which can lead to power output loss in the photovoltaic module when external stress is applied to it.

CN110894411 (Ruilibo) is directed to a conductive adhesive composition having utility in the assembly of shingled solar cells, said adhesive composition comprising: an epoxy monomer; toughened resin; silver powder; rheological agent; and a latent hardener for said epoxy resin comprising boron tetrafluoride.

U.S. Pat. No. 6,344,157 B1 (Cheng et al.) describes a composition with improved electrical stability for use in microelectronic devices, said composition comprising: (a) a polymeric resin; (b) a conductive filler; (c) a corrosion inhibitor; (d) optionally a reactive or a nonreactive diluents; (e) optionally, an inert filler; and, (f) optionally, an adhesion promoter, wherein the corrosion inhibitor is 8-hydroxyquinoline.

U.S. Pat. No. 7,326,369 B2 (Cheng et al.) describes a low stress conductive film or paste adhesive that comprises: a) one or more functional acrylic copolymers or terpolymers; b) epoxy; and, c) conductive filler. The copolymer a) is of high molecular weight and preferably has hydroxyl, carboxylic acid, isocyanate or epoxy functionality to improve its solvent and epoxy compatibility.

U.S. Pat. No. 7,108,806 B2 (Xiao et al.) describes an electrically conductive adhesive composition comprising: a) an epoxy functional amine-epoxy adduct obtained by reacting at least one epoxy resin with an aliphatic amine; b) a conductive filler; c) at least one of a corrosion inhibitor and an oxygen scavenger; d) a curing agent/catalyst consisting of imidazole; and, e) optionally other additives such as organic solvents, flow additives, adhesion promoters and rheology modifiers.

EP1715004A1 (National Starch and Chemical Investment Holding Company) discloses adhesive compositions having utility in microelectronic applications, said compositions comprising: (a) a resin capable of curing by free-radical polymerization or by hydrosilation; (b) an epoxy compound having vinyl or allyl functionality; (c) a curing agent for the resin (a); and, optionally, a filler. The composition is characterized in that there is no curing agent for the epoxy compound present.

It will be recognized that photovoltaic modules are subjected to temperature changes and high mechanical stresses over their life cycle. Whilst these factors have a negative effect on the lifetime of the photovoltaic module, they also impose requirements on the thermo-mechanical properties of the electrically conductive adhesive used to bond the constituent solar and/or photovoltaic cells together: the adhesives should overcome mechanical stresses which build up due to coefficient of thermal expansion (CTE) mismatches between the different materials used in the photovoltaic assembly; and, the polymer matrix of the adhesive should desirably not pass through its glass transition temperature (Tg) within the operating range of the module such that it is in a glassy, brittle state at strongly negative temperatures (−10° C. and below).

Aside from the properties of the obtained cured adhesive, the curing profile of the adhesive is also of great import. It is important that: the shelf life of the adhesive at room temperature is practicable; the cure time is practicable at a temperature which does not deleteriously effect the electronic components and metalized features; the adhesive is applicable—preferably dispensable or printable—and curable within an industrial process for high volume manufacturing; and, bleeding of the adhesive from the constituent joints is negligible.

STATEMENT OF THE INVENTION

In accordance with a first aspect of the invention there is provided an electrically conductive composition comprising:
- a) a resin component comprising
  - 1) a first epoxy resin; and
  - 2) a second epoxy resin and/or a functionalised polybutadiene resin and/or a functionalised butadiene-acrylonitrile copolymer;
- b) a curative for epoxy resin;
- c) an electrically conductive filler;
- d) a core shell rubber toughener; and,
- e) a reactive diluent component comprising
  - 1) a monofunctional epoxy reactive diluent and/or
  - 2) a polyfunctional epoxy reactive diluent;

wherein said composition further comprises a curing agent if said functionalised polybutadiene resin is present in said resin component.

An exemplary electrically conductive composition comprises, based on the weight of the composition:
- from 4 to 40 wt. % of a) said resin component comprising 1) said first epoxy resin and 2) said second epoxy resin and/or said functionalised polybutadiene resin and/or said functionalised butadiene-acrylonitrile copolymer;
- from 0.5 to 7 wt. %, preferably from 1 to 6 wt. % of b) said curative;
- from 55 to 80 wt. %, preferably from 60 to 76 wt. % of c) said electrically conductive filler;
- from 0.1 to 5 wt. %, preferably from 0.2 to 4.5 wt. % of d) said core shell rubber toughener; and,
- from 1 to 15 wt. % of e) said reactive diluent component comprising
  - 1) a monofunctional epoxy reactive diluent and/or
  - 2) a polyfunctional epoxy reactive diluent;

wherein said composition further comprises a curing agent if said functionalised polybutadiene resin is present in said resin component.

In an embodiment; said first epoxy resin is selected from the group consisting of: aliphatic epoxy resin; cycloaliphatic epoxy resin; epoxy novolac resin; bisphenol-A-epoxy resin; bisphenol-F-epoxy resin; hydrogenated bisphenol-A-epoxy resin; hydrogenated bisphenol-F-epoxy resin; bisphenol-A epichlorohydrin based epoxy resin; polyepoxies; propylene glycol epoxy resin; reaction products of polyether-polyol with epichlorohydrin; and, epoxy silicone co-polymers. It is preferred that said first epoxy resin is selected from the group consisting of: bis-phenol A epoxy resin, bis-phenol F epoxy resin and a mixture of bis-phenol A epoxy resin and bis-phenol F epoxy resin.

Said second epoxy resin, when present, is distinct from said first epoxy resin and is desirably selected from the group consisting of epichlorohydrin formaldehyde phenol resin; epichlorohydrin phenol novolac resin; epichlorohydrin o-cresol novolac resin; epichlorohydrin m-xylenediamine resin; epichlorohydrin diamino diphenyl methane resin; and, epichlorohydrin trimethylol propane resin. A preference for epichlorohydrin phenol novolac resin as said second epoxy resin may be noted.

Said functionalised polybutadiene resin, when present, is preferably selected from the group consisting of maleic anhydride functionalised polybutadiene, vinyl functionalised polybutadiene, maleic anhydride grafted vinyl functionalised polybutadiene, epoxidized polybutadiene and mixtures thereof. A preference for one or more of maleic anhydride functionalised polybutadiene and maleic anhydride grafted vinyl functionalised polybutadiene should be acknowledged.

Said functionalised butadiene-acrylonitrile copolymer, when present, is preferably selected from the group consisting of epoxy-modified butadiene-acrylonitrile copolymer, carboxyl-modified butadiene-acrylonitrile copolymer, amine-modified butadiene-acrylonitrile copolymer, alcohol-modified butadiene-acrylonitrile copolymer and mixtures thereof. A preference for one or more of epoxy-modified butadiene-acrylonitrile copolymer and carboxyl-modified butadiene-acrylonitrile copolymer is mentioned.

Irrespective of the above choices of the resin component a), it is preferred that the electrically conductive filler of the composition is selected from the group consisting of: silver; nickel; carbon; carbon black; graphite; graphene; copper; gold; platinum; aluminium; iron; zinc; cobalt; lead; tin alloys; silver coated nickel; silver coated copper; silver coated graphite; silver coated polymers, for example silver coated acrylic polymers and/or silver coated silicone based polymers; silver coated aluminium; silver coated glass; silver coated carbon; silver coated boron nitride; silver coated aluminium oxide; silver coated aluminium hydroxide; nickel coated graphite; and, mixtures thereof. The use of particulate silver is particularly preferred.

The curative b) of the composition is desirably either an amine-based hardener or a nitrogen containing epoxy adduct and is preferably selected from the group consisting of cycloaliphatic amines, aliphatic amines, polyether amines, amine-epoxy adducts, imidazole-epoxy adducts, imidazole, imidazole derivatives, polyether amines and mixtures thereof. A preference for a curative b) comprising or consisting of at least one of an imidazole-epoxy adduct, an amine-epoxy adduct, and an imidazole may be acknowledged.

In accordance with a second aspect of the invention, there is provided a cured product of the electrically conductive composition as defined herein above and in the appended claims.

The present invention also provides for the use of either the electrically conductive composition as defined herein above and in the appended claims or the cured product obtained there from on a solar cell and/or in a photovoltaic module, preferably as an interconnection material to connect solar cells into a photovoltaic module. For instance, said curable composition or cured product may be used as an interconnection material in a photovoltaic module, wherein the solar cells are shingled, or in-series connected with metal ribbons.

In a further aspect of the invention there is provided a photovoltaic module comprising a series-connected string of two or more solar cells in a shingle pattern having an electrically conductive bonding between said two or more solar cells, wherein said electrically conductive bonding is formed either with an electrically conductive composition as defined herein above and in the appended claims or with a cured product obtained there from. To form said module, said electrically conductive composition has preferably been applied by dispensing, jetting or printing.

BRIEF DESCRIPTION OF THE DRAWINGS

The background to the invention has been described with reference to the appended drawings in which.

DEFINITIONS

Figure 1:
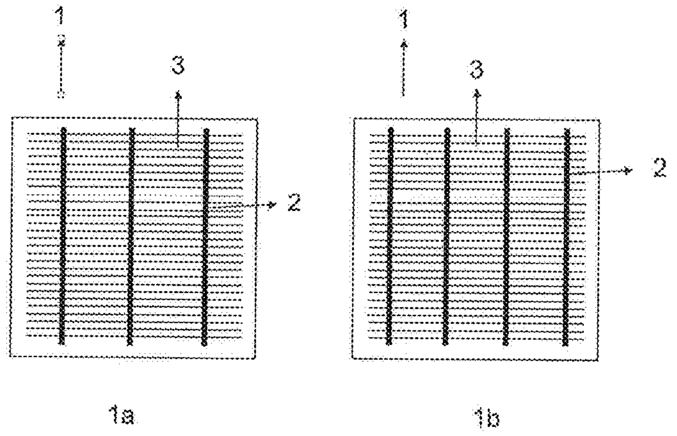
FIG. 1 illustrates a structure of a typical silicon solar cell.
Figure 2:
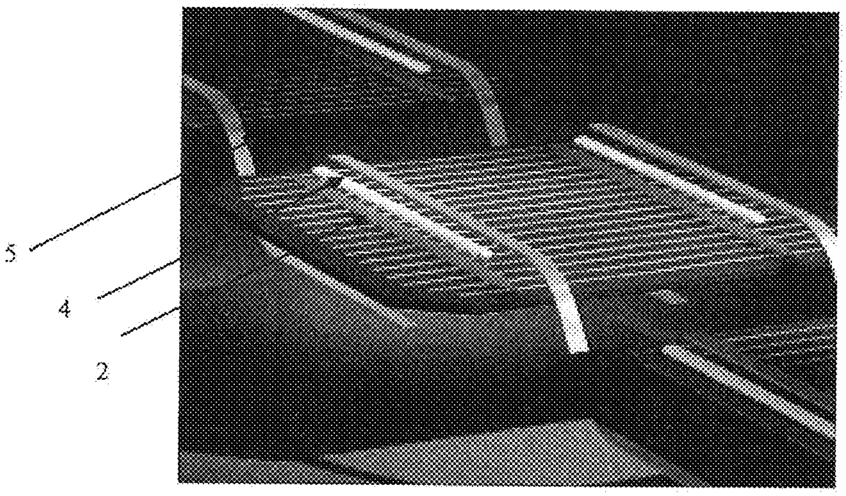
FIG. 2 illustrates a conventional photovoltaic module.
Figure 3:
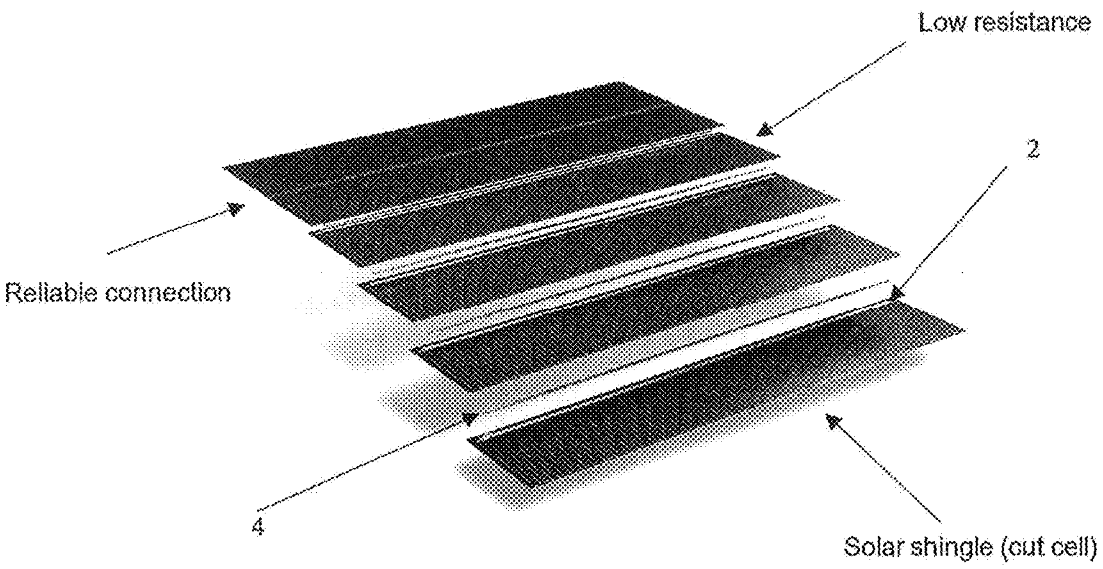
FIG. 3 illustrates a shingled photovoltaic module.

As used herein, the singular forms “a”, “an” and “the” include plural referents unless the context clearly dictates otherwise.

The terms “comprising”, “comprises” and “comprised of” as used herein are synonymous with “including”, “includes”, “containing” or “contains”, and are inclusive or open-ended and do not exclude additional, non-recited members, elements or method steps.

As used herein, the term “consisting of” excludes any element, ingredient, member or method step not specified.

When amounts, concentrations, dimensions and other parameters are expressed in the form of a range, a preferable range, an upper limit value, a lower limit value or preferable upper and limit values, it should be understood that any ranges obtainable by combining any upper limit or preferable value with any lower limit or preferable value are also specifically disclosed, irrespective of whether the obtained ranges are clearly mentioned in the context.

Further, in accordance with standard understanding, a weight range represented as being “from 0” specifically includes 0 wt. %: the ingredient defined by said range may or may not be present in the composition.

The words “preferred”, “preferably”, “desirably” and “particularly” are used frequently herein to refer to embodiments of the disclosure that may afford particular benefits, under certain circumstances. However, the recitation of one or more preferable, preferred, desirable or particular embodiments does not imply that other embodiments are not useful and is not intended to exclude those other embodiments from the scope of the disclosure.

As used throughout this application, the word “may” is used in a permissive sense—that is meaning to have the potential to—rather than in the mandatory sense.

As used herein, room temperature is 23° C. plus or minus 2° C. As used herein, “ambient conditions” means the temperature and pressure of the surroundings in which the composition is located or in which a coating layer or the substrate of said coating layer is located.

The term “monofunctional”, as used herein, refers to having one polymerizable moiety. The term “polyfunctional”, as used herein, refers to having more than one polymerizable moiety.

As used herein, the term “equivalent (eq.)” relates, as is usual in chemical notation, to the relative number of reactive groups present in the reaction.

The term “equivalent weight” as used herein refers to the molecular weight divided by the number of a function concerned. As such, “epoxy equivalent weight” (EEW) means the weight of resin, in grams, that contains one equivalent of epoxy. Equally, the “amine hydrogen equivalent weight" (AHEW) is the weight of the organic amine, in grams, that contains one amine hydrogen.

As used herein, the term "epoxy" denotes a compound characterized by the presence of at least one cyclic ether group, namely one wherein an ether oxygen atom is attached to two adjacent carbon atoms thereby forming a cyclic structure. The term is intended to encompass monoepoxy compounds, polyepoxy compounds (having two or more epoxy groups) and epoxy terminated prepolymers. The term "monofunctional epoxy compound" is meant to denote epoxy compounds having one epoxy group. The term "polyfunctional epoxy compound" is meant to denote epoxy compounds having at least two epoxy groups. The term "diepoxy compound" is meant to denote epoxy compounds having two epoxy groups.

The epoxy may be unsubstituted but may also be inertly substituted. Exemplary inert substituents include chlorine, bromine, fluorine and phenyl.

As used herein, "(meth)acryl" is a shorthand term referring to "acryl" and/or "methacryl". Thus the term "(meth) acrylamide" refers collectively to acrylamide and methacrylamide.

As used herein, "$C_1$-$C_n$ alky" group refers to a monovalent group that contains 1 to n carbons atoms, that is a radical of an alkane and includes straight-chain and branched organic groups. As such, a "$C_1$-$C_{30}$ alkyl" group refers to a monovalent group that contains from 1 to 30 carbons atoms, that is a radical of an alkane and includes straight-chain and branched organic groups. Examples of alkyl groups include, but are not limited to: methyl; ethyl; propyl; isopropyl; n-butyl; isobutyl; sec-butyl; tert-butyl; n-pentyl; n-hexyl; n-heptyl; and, 2-ethylhexyl. In the present invention, such alkyl groups may be unsubstituted or may be substituted with one or more substituents such as halo, nitro, cyano, amido, amino, sulfonyl, sulfinyl, sulfanyl, sulfoxy, urea, thiourea, sulfamoyl, sulfamide and hydroxy. Where applicable, a preference for a given substituent will be noted in the specification. In general, however, a preference for unsubstituted alkyl groups containing from 1-18 carbon atoms ($C_1$-$C_{18}$ alkyl)—for example unsubstituted alkyl groups containing from 1 to 12 carbon atoms ($C_1$-$C_{12}$ alkyl) or from 1 to 6 carbon atoms ($C_1$-$C_6$ alkyl)—should be noted.

The term "$C_1$-$C_{18}$ hydroxyalkyl" as used herein refers to a HO-(alkyl) group having from 1 to 18 carbon atoms, where the point of attachment of the substituent is through the oxygen-atom and the alkyl group is as defined above.

An "alkoxy group" refers to a monovalent group represented by —OA where A is an alkyl group: non-limiting examples thereof are a methoxy group, an ethoxy group and an iso-propyloxy group. The term "$C_1$-$C_{18}$ alkalkoxy" as used herein refers to an alkyl group having an alkoxy substituent as defined above and wherein the moiety (alkyl-O-alkyl) comprises in total from 1 to 18 carbon atoms: such groups include methoxymethyl ($—CH_2OCH_3$), 2-methoxyethyl ($—CH_2CH_2OCH_3$) and 2-ethoxyethyl.

The term "$C_2$-$C_4$ alkylene" as used herein, is defined as saturated, divalent hydrocarbon radical having from 2 to 4 carbon atoms.

The term "$C_3$-$C_{10}$ cycloalkyl" is understood to mean an optionally substituted, saturated, mono- or polycyclic hydrocarbon group having from 3 to 10 carbon atoms. Examples of cycloalkyl groups include: cyclopropyl; cyclobutyl; cyclopentyl; cyclohexyl; cycloheptyl; cyclooctyl; adamantane; and, norbornane.

As used herein, an "$C_6$-$C_{18}$ aryl" group used alone or as part of a larger moiety—as in "aralkyl group"—refers to optionally substituted, monocyclic, bicyclic and tricyclic ring systems in which the monocyclic ring system is aromatic or at least one of the rings in a bicyclic or tricyclic ring system is aromatic. The bicyclic and tricyclic ring systems include benzofused 2-3 membered carbocyclic rings. Exemplary aryl groups include: phenyl; indenyl; naphthalenyl, tetrahydronaphthyl, tetrahydroindenyl; tetrahydroanthracenyl; and, anthracenyl. And a preference for phenyl groups may be noted.

As used herein, "$C_2$-$C_{20}$ alkenyl" refers to hydrocarbyl groups having from 2 to 20 carbon atoms and at least one unit of ethylenic unsaturation. The alkenyl group can be straight chained, branched or cyclic and may optionally be substituted. The term "alkenyl" also encompasses radicals having "cis" and "trans" configurations, or alternatively, "E" and "Z" configurations, as appreciated by those of ordinary skill in the art. In general, however, a preference for unsubstituted alkenyl groups containing from 2 to 10 ($C_{2-10}$) or 2 to 8 ($C_{2-8}$) carbon atoms should be noted. Examples of said $C_2$-$C_{12}$ alkenyl groups include, but are not limited to: $—CH{=}CH_2$; $—CH{=}CHCH_3$; $—CH_2CH{=}CH_2$; $—C({=}CH_2)(CH_3)$; $—CH{=}CHCH_2CH_3$; $—CH_2CH{=}CHCH_3$; $—CH_2CH_2CH{=}CH_2$; $—CH{=}C(CH_3)_2$; $—CH_2C({=}CH_2)(CH_3)$; $—C({=}CH_2)CH_2CH_3$; $—C(CH_3){=}CHCH_3$; $—C(CH_3)CH{=}CH_2$; $—CH{=}CHCH_2CH_2CH_3$; $—CH_2CH{=}CHCH_2CH_3$; $—CH_2CH_2CH{=}CHCH_3$; $—CH_2CH_2CH_2CH{=}CH_2$; $—C({=}CH_2)CH_2CH_2CH_3$; $—C(CH_3){=}CHCH_2CH_3$; $—CH(CH_3)CH{=}CHCH$; $—CH(CH_3)CH_2CH{=}CH_2$; $—CH_2CH{=}C(CH_3)_2$; 1-cyclopent-1-enyl; 1-cyclopent-2-enyl; 1-cyclopent-3-enyl; 1-cyclohex-1-enyl; 1-cyclohex-2-enyl; and, 1-cyclohexyl-3-enyl.

As used herein, "alkylaryl" refers to alkyl-substituted aryl groups and "substituted alkylaryl" refers to alkylaryl groups further bearing one or more substituents as set forth above. Further, as used herein "aralkyl" means an alkyl group substituted with an aryl radical as defined above: exemplary ($C_1$-$C_4$)alkylphenyl groups include as tolyl and ethylphenyl.

The term "hetero" as used herein refers to groups or moieties containing one or more heteroatoms, such as N, O, Si and S. Thus, for example "heterocyclic" refers to cyclic groups having, for example, N, O, Si or S as part of the ring structure. "Heteroalkyl" and "heterocycloalkyl" moieties are alkyl and cycloalkyl groups as defined hereinabove, respectively, containing N, O, Si or S as part of their structure.

As used herein, the term "catalytic amount" means a sub-stoichiometric amount of catalyst relative to a reactant, except where expressly stated otherwise.

As employed herein a "primary amino group" refers to an $NH_2$ group that is attached to an organic radical, and a "secondary amino group" refers to an NH group that is attached to two organic radicals, which may also together be part of a ring. The term "tertiary amine" thus references a nitrogen bearing moiety of which a nitrogen atom is not bound to a hydrogen atom. Where used, the term "amine hydrogen" refers to the hydrogen atoms of primary and secondary amino groups.

The molecular weights referred to in this specification can be measured with gel permeation chromatography (GPC) using polystyrene calibration standards, such as is done according to ASTM 3536.

As used herein, "anhydrous" means the relevant composition includes less than 0.25% by weight of water. For example, the composition may contain less than 0.1% by weight of water or be completely free of water.

Unless otherwise stated, the term "particle size" refers to the largest axis of the particle. In the case of a generally spherical particle, the largest axis is the diameter.

The term "mean particle size" (D50), as used herein, refers to a particle size corresponding to 50% of the volume of the sampled particles being greater than and 50% of the volume of the sampled particles being smaller than the recited D50 value. Similarly, if used, the term "D90" refers to a particle size corresponding to 90% of the volume of the sampled particles being smaller than and 10% of the volume of the sampled particles being greater than the recited D90 value.

All references cited in the present specification are hereby incorporated by reference in their entirety.

The electrically conductive composition has been defined hereinabove as having particular utility as a curable adhesive composition in solar cells and solar modules. It should be stated, however, that the composition may be claimed and may be afforded any or all feature(s) afforded to the composition but without limitation to use within/for adhering solar modules, solar cells and components thereof. The composition may, for instance, find utility in the adhesion of other electronic components and devices.

The term definitions have been included above to allow the skilled reader to better appreciate the teaching of the present invention. Where particular technical and scientific terms are used to characterize the invention but are not defined above, those terms have the meaning as commonly understood by one of the ordinary skill in the art to which this invention belongs to.

DETAILED DESCRIPTION OF THE INVENTION a) i) First Epoxy Resin

The composition of the present invention comprises a first epoxy resin a) i), which first epoxy resin should typically constitute from 4 to 17% by weight of the total weight of the composition. It is preferred that said first epoxy resin is present in an amount of from 5 to 16 wt. %, for example from 6 to 16 wt. % based on the total weight of the composition.

The first epoxy resin of the present invention is a liquid characterized by a viscosity of at least 1 Pa·s at 25° C. and 50% Relative Humidity (RH), for example by a viscosity of from 1 to 15 Pa·s or from 2.5 to 12.5 Pa·s as determined at 25° C. and 50% Relative Humidity (RH). The first epoxy resin may be further characterized by an epoxy equivalent weight of from 100 to 700 g/eq, for example from 100 to 350 g/eq. And generally, diepoxy compounds having epoxy equivalent weights of less than 500 g/eq. or even less than 400 g/eq. are preferred: this is predominantly from a costs standpoint, as in their production, lower molecular weight epoxy resins require more limited processing in purification.

Viscosity of the epoxy resin is measured at 25° C. on a Rheometer from TA Instruments Rheometer HR-1 or Q-2000 using a 2 degrees cone-plate geometry with a 2 cm in diameter plate and shear rates of 15 $s^{-1}$. Viscosity units are reported in Pa·s.

Broadly, the first epoxy resin as used herein may be selected from monofunctional epoxy resins, di-functional epoxy resins and multi- or poly-functional epoxy resins. The first epoxy resin may be saturated or unsaturated, aliphatic, cycloaliphatic, aromatic or heterocyclic and may be substituted. Further, the epoxy resin may also be monomeric or polymeric.

As examples of broad types or groups of (poly)epoxy compounds which may be included as the first epoxy resin in the present invention, mention may be made of: glycidyl ethers of polyhydric alcohols and polyhydric phenols; glycidyl esters of polycarboxylic acids.

In certain embodiments, the first epoxy resin is selected from the group consisting of: aliphatic epoxy resin; cycloaliphatic epoxy resin; epoxy novolac resin; bisphenol-A-epoxy resin; bisphenol-F-epoxy resin; hydrogenated bisphenol-A-epoxy resin; hydrogenated bisphenol-F-epoxy resin; bisphenol-A epichlorohydrin based epoxy resin; propylene glycol epoxy resin; reaction products of polyether-polyol with epichlorohydrin; polycarbonatediol based glycidyl ethers; and, epoxy silicone co-polymers. It is preferred that said first epoxy resin is selected from the group consisting of: bis-phenol A epoxy resin; and bis-phenol F epoxy resin.

Exemplary commercial epoxy resins for use as said first epoxy resin include: EPON® DPL-862, EPON(Resin 828, EPON® Resin 826 and EPON® Resin 825 available from Hexion; Epo Tohto ZX 1059 (CAS No. 385801-30-9) available from Tohto Kasei Co. Ltd.; and, DER™ 331, DER™ 383, DER™ 354 and DER™ 732, available from Olin.

a) ii) Second Epoxy Resin

The presence of a second epoxy resin is optional in the present invention. However, when present in the composition, said second epoxy resin should be included in an amount of from 0.3 to 3 wt. %, based on the total weight of the composition, preferably from 0.5 to 2.5 wt. %, for example from 0.6 to 2.0 wt. %.

Any second epoxy resin added is necessarily distinct from said first epoxy resin. The second epoxy resin may either be a solid or be a liquid characterized by a viscosity of at least 1 Pa·s at 25° C. and 50% Relative Humidity (RH), for example a viscosity of from 1 to 15 Pa·s or from 2.5 to 12.5 Pa·s as determined at 25° C. and 50% Relative Humidity (RH). Furthermore, the second epoxy resin may be further characterized by an epoxy equivalent weight of from 100 to 700 g/eq, for example from 100 to 350 g/eq. And again generally, diepoxy compounds having epoxy equivalent weights of less than 500 g/eq. or even less than 400 g/eq. are preferred. However, it should be mentioned that the first and second epoxy resins may possess the same or different numbers of epoxy groups per molecule.

The viscosity of epoxy resin is measured at 25° C. on a Rheometer from TA Instruments Rheometer HR-1 or Q-2000 using a 2 degrees cone-plate geometry with a 2 cm in diameter plate and shear rates of 15 $s^{-1}$. Viscosity units are reported in Pa·s.

Without intention to limit the present invention, the second epoxy resin desirably selected from the group consisting of: epichlorohydrin formaldehyde phenol resin; epichlorohydrin phenol novolac resin; epichlorohydrin o-cresol novolac resin; epichlorohydrin m-xylenediamine resin; epichlorohydrin diamino diphenyl methane resin; epichlorohydrin trimethylol propane resin; and, mixtures thereof. A preference for epichlorohydrin phenol novolac resin as said second epoxy resin may be noted.

Exemplary commercial epoxy resins for use as said second epoxy resin include: Epiclon N730A available from DIC Corporation; and, EPALLOY® 8240, 8250, 8280 and 8330 available from Huntsman; and, BNE, CNE, DNE and PNE series available from Chang Chun Group (CCP).

a) iii) Functionalised Polybutadiene Resin

The presence of at least one functionalized polybutadiene resin is optional in the present invention. However, when present in the composition, said functionalized polybutadiene should be included in an amount of from 0.1 to 15 wt. %, based on the total weight of the composition, preferably from 5 to 12 wt. %, for example from 8 to 11 wt. %.

The or each functionalized polybutadiene resin should desirably meet at least one of the following conditions: a number average molecular weight (Mn) in the range of 500 to 15000 Daltons, preferably from 1000 to 10000 Daltons; and, a functionality of from 1.5 to 11, preferably from 1.5 to 7 and even more preferably from 2 to 6.

Without intention to limit the present invention, the functionalized polybutadiene resin should be selected from: carboxyl functionalized polybutadiene polymers; hydroxyl functionalized polybutadiene polymers, preferably those having terminal hydroxyl groups; epoxidized polybutadiene polymers, such as epoxidized, acrylated polybutadiene polymers; vinyl-terminated polybutadiene polymers; (meth) acrylate-terminated polybutadiene polymers; end-functional polybutadiene polymers which may be prepared by reacting the hydroxyl groups of a corresponding hydroxyl-terminated polymer with an appropriate reagent such as a carboxylic acid, an acid chloride or an anhydride such as maleic anhydride; and, mixtures of said polymers. A preference may be noted for the use of maleic anhydride functionalised polybutadiene polymers, maleic anhydride grafted vinyl functionalised polybutadiene polymers and mixtures thereof.

Exemplary hydroxyl functionalized polybutadiene resins include: those resins available in the PolyBD® series from Sartomer company, such as PolyBD® R-20LM, PolyBD® R-45M, PolyBD® R-45HTLO, PolyBD® LF-1, PolyBD® LF-2, PolyBD® LF-3, PolyBD® LF-5, PolyBD® LF-6, PolyBD®LF-7; those resins available in the Krasol® series available from Sartomer, such as Krasol® HLBH-P 3000, Krasol® LBH 2000, Krasol® LBH 3000, Krasol® LBH 5000, Krasol® LBH 10000, Krasol® LBH-P 2000, Krasol® LBH-P 3000, Krasol® LBH-P 5000, Krasol® LBH-P 10000 and Krasol® LBH 2040; and, those available in the NISSO series from Mitsubishi International Corporation, such as NISSO-PB G-1000, NISSO-PB G-2000, NISSO-PB G-3000, NISSO-PB GI-1000, NISSO-PB GI-2000 and, NISSO-PB GI-3000.

Exemplary commercially available carboxy functionalized polybutadiene polymers include: HYPRO® 2000X162CTB and HYPRO® CS 8596 available from Huntsman.

Exemplary commercially available vinyl functionalized polybutadienes include: RICON® 100, 130, 131, 134, 142, 150, 152, 153, 154, 156, 157, 181 and 184 and P30D available from Total.; and PolyBD® R45VT from Total.

Exemplary (meth)acrylate functionalized butadienes include but are not limited to: RICACRYL® 3100, RICACRYL® 3500 and RICACRYL® 3801 commercially available from Total; and, CN-301, CN-302, CN-303, and CN-307 commercially available from Sartomer.

Exemplary maleic anhydride grafted vinyl functionalized polybutadienes and the alcohol condensates derived therefrom include: RICON®130MA8, RICON®130MA13, RICON®130MA20, RICON®131MA5, RICON®131MA10, RICON®131MA17, RICON®131MA20, RICON®184MA6 and RICON®156MA17, available from Total.

Where the functionalized polybutadiene resin is present in the composition, the composition will further comprise a curing agent for said resin, conventionally in an amount of from 0.05 to 2% by weight of the total weight of the composition, for example from 0.1 to 1.5% or from 0.1 to 1%. The reactive moieties of this curing agent will be determined by the particular functions present upon the functionalized polybutadiene resin. Oftentimes, the curing agent will include at least two reactive groups that are capable of reacting with the functional groups on the functionalized polybutadiene polymer.

As exemplary curing agents reference may be made to: (poly)carboxylic acids; polyisocyanates; blocked polyisocyanate; anhydrides; aminoplast resins including in particular amine/aldehyde condensates which are preferably at least partially etherified and more preferably fully etherified; boron trihalides including in particular boron trichloride, boron trifluoride, latent boron trifluoride chelates and latent boron trichloride chelates; and, peroxides.

Suitable polyisocyanates include any aliphatic, cycloaliphatic, arylaliphatic, heterocyclic or aromatic polyisocyanate, or mixture thereof, having an average isocyanate functionality of at least 2.0 and an equivalent weight of at least 80. The isocyanate functionality of the polyisocyanate will more generally be from 2.2 to 4.0, for example 2.3 to 3.5. Whilst functionalities greater than 4.0 may be used, their use can cause excessive crosslinking. The equivalent weight of the polyisocyanate is typically from 100 to 300, preferably from 110 to 250, and more preferably from 120 to 200.

The polyisocyanates, where required, may have been biuretized and/or isocyanurated by generally known methods, such as described in UK Patent No. 889,050.

Examples of suitable polyisocyanates include but are not limited to: ethylene diisocyanate; 1,4-tetramethylene diisocyanate; hexamethylene diisocyanate (HDI); biuret or trimers of HDI; 1,12-dodecane diisocyanate, cyclobutane-1,3-diisocyanate cyclohexane-1,3- and 1,4-diisocyanate and mixtures of these isomers; 1-isocyanato-3,3,5-trimethyl-5-isocyanato methyl cyclohexane; 2,4- and 2,6-hexahydrotolylene diisocyanate and mixtures of these isomers; hexahydrol, 3- and/or 1,4-phenylene diisocyanate; perhydro-2,5'- and/or 4,4'-diphenyl methane diisocyanate; 1,3- and 1,4-phenylene diisocyanate; 2,4- and 2,6-tolylene diisocyanate and mixtures of these isomers; diphenyl methane-2,4'- and/or 4,4'-diisocyanate (MDI); naphthylene-1,5-diisocyanate; triphenyl methane-4,4',4'-tri-isocyanate; and, polyphenyl polymethylene polyisocyanates of the type obtained by condensing aniline with formaldehyde, followed by phosgenation such as described in UK Patent Nos. 874,430 and 848,671. It is noted that di- and/or polyisocyanates comprising ester, urea, allophanate, carbodiimide, uretdione and/or urethane groups may also be used in the process according to the invention.

Illustrative peroxide compounds suitable for use herein are organic peroxides, selected for example from: cyclic peroxides; diacyl peroxides; dialkyl peroxides; hydroperoxides; peroxycarbonates; peroxydicarbonates; peroxyesters; and, peroxyketals.

In an embodiment of the invention, the free radical initiator comprises or consists of at least one peroxide compound represented by the formula:

$$R^pOOR^q$$

wherein: $R^p$ is an aliphatic or aromatic group containing up to 18 carbon atoms, and $R^q$ is H or an aliphatic or aromatic group containing up to 18 carbon and preferably wherein: $R^p$ and $R^q$ are $C_1$-$C_{12}$ alkyl, $C_6$-$C_{18}$ aryl or $C_7$-$C_{18}$ aralkyl groups.

As exemplary peroxide compounds, which may be used alone or in combination, there may be mentioned: cumene hydroperoxide (CHP); para-menthane hydroperoxide; t-butyl hydroperoxide (TBH); t-butyl perbenzoate; t-butyl peroxy pivalate; di-t-butyl peroxide; t-butyl peroxy acetate; t-butyl peroxy-2-hexanoate; t-amyl hydroperoxide; 1,2,3,4-tetramethylbutyl hydroperoxide; benzoyl peroxide; dibenzoyl peroxide; 1,3-bis(t-butylperoxyisopropyl) benzene;

diacetyl peroxide; butyl 4,4-bis (t-butylperoxy) valerate; p-chlorobenzoyl peroxide; t-butyl cumyl peroxide; di-t-butyl peroxide; dicumyl peroxide; di(dodecanoyl) peroxide; 2,5-dimethyl-2,5-di-t-butylperoxyhexane; 2,5-dimethyl-2,5-di-t-butyl-peroxyhex-3-yne; and, 4-methyl-2,2-di-t-butylperoxypentane.

These exemplary peroxide compound based curing agents provide ideal balance between profile, cure speed, adhesion and electrical properties.

a) iv) Functionalised Butadiene-Acrylonitrile Co-Polymer

The presence of at least one functionalised butadiene-acrylonitrile co-polymer is optional in the present invention. However, when present in the composition, said functionalized butadiene-acrylonitrile co-polymer should be included in an amount of from 0.1 to 5 wt. %, based on the total weight of the composition, preferably from 1 to 5 wt. %, for example from 2 to 5 wt. %.

The or each functionalized butadiene-acrylonitrile co-polymer should desirably meet at least one of the following conditions: a number average molecular weight (Mn) in the range of 500 to 15000 Daltons, preferably from 1000 to 10000 Daltons; and, a functionality of from 1.5 to 5, preferably from 1.5 to 4.

Without intention to limit the present invention, the functionalized butadiene-acrylonitrile co-polymer should be selected from: epoxy-functionalized butadiene-acrylonitrile co-polymers; carboxyl-functionalized butadiene-acrylonitrile co-polymers; vinyl-functionalized butadiene-acrylonitrile co-polymers; amine-functionalized butadiene-acrylonitrile co-polymers; hydroxyl-functionalized butadiene-acrylonitrile co-polymers; and, mixtures thereof. A preference may be mentioned for the use of epoxy-functionalized butadiene-acrylonitrile co-polymers, carboxyl-functionalized butadiene-acrylonitrile co-polymers or mixtures thereof.

Exemplary functionalized butadiene-acrylonitile co-polymers include: as carboxy terminated poly(butadiene co-acrylonitrile) polymers, HYPRO®1300X31CTBN, HYPRO®1300X8 CTBN, HYPRO®1300X13 CTBN, HYPRO®1300X9CTBNX and HYPRO® 1300X18 CTBNX available from Huntsman; as vinyl and carboxyl functionalized poly(butadiene co-acrylonitrile) polymers, HYPRO® 1300X33 VTBNX and HYPRO® 1300X43 VTBNX available from Huntsman; as epoxy terminated poly(butadiene co-acrylonitrile) polymers, HYPRO®1300X40 ETBN available from Huntsman; as amine terminated poly(butadiene co-acrylonitrile) polymers, HYPRO® 1300X21ATBN, HYPRO®1300X16ATBN, HYPRO®1300X45 ATBN, HYPRO®1300X35ATBN, and HYPRO® 1300X42 ATBN available from Huntsman.

The applicant has found out that the resin component comprising (or optionally consisting of) 1) a first epoxy resin; and 2) a second epoxy resin and/or a functionalised polybutadiene resin and/or a functionalised butadiene-acrylonitrile copolymer provides ideal flexibility to a cured composition according to the present invention while having an ideal storage modulus. As a comparison combination of epoxy resin and cyanate ester resin for example, would result in more stiff cured composition with too high storage modulus.

b) Curative

The composition of the present invention necessarily comprises a curative b) for the epoxy compounds. The curative may comprise or consist of at least one compound which possesses at least two epoxy reactive groups per molecule. The curative might also comprise or consist of at least one latent curative which becomes reactive towards said epoxy groups once a triggering event occurs. In particular, such latent curative(s) may be stable at room temperature but be activated at an elevated high temperature.

In an embodiment, the curative b) may include one or more of: i) at least one compound having at least two amine hydrogens reactive toward epoxy groups; ii) at least one mercapto compound having at least two mercapto groups reactive toward epoxy groups; and, iii) Mannich bases. The at least one compound having at least two amine hydrogens reactive toward epoxy groups should, in particular, contain primary and/or secondary amine groups and have an equivalent weight per primary or secondary amine group of not more than 150 g/eq., more preferably not more than 125 g/eq.

Suitable polyamines, which may be used alone or in combination as curatives in the present invention, include but are not limited to the following:

a) Aliphatic, cycloaliphatic or arylaliphatic primary diamines of which the following examples may be mentioned: 2,2-dimethyl-1,3-propanediamine; 1,3-pentanediamine (DAMP); 1,5-pentanediamine; 1,5-diamino-2-methylpentane (MPMD); 2-butyl-2-ethyl-1,5-pentanediamine (C11-neodiamine); 1,6-hexanediamine (hexamethylenediamine, HMDA); 2,5-dimethyl-1,6-hexanediamine; 2,2,4- and/or 2,4,4-trimethylhexamethylenediamine; 1,7-heptanediamine; 1,8-octanediamine; 1,9-nonanediamine; 1,10-decanediamine; 1,11-undecanediamine; 1,12-dodecanediamine; 1,2-, 1,3- and 1,4-diaminocyclohexane; bis(4-aminocyclohexyl) methane; bis(4-amino-3-methylcyclohexyl)methane; bis(4-amino-3-ethylcyclohexyl)methane; bis(4-amino-3,5-dimethylcyclohexyl)methane; bis(4-amino-3-ethyl-5-methylcyclohexyl)methane; 1-amino-3-aminomethyl-3,5,5-trimethylcyclohexane (isophorone diamine, IPDA); 2- and/or 4-methyl-1,3-diaminocyclohexane; 1,3-bis(aminomethyl)-cyclohexane; 1,4-bis (aminomethyl)cyclohexane; 2,5(2,6)-bis(aminomethyl)-bicyclo[2.2.1]heptane (norborane diamine, NBDA); 3(4),8(9)-bis(aminomethyl)tricyclo[5.2.1.0$^{2,}$ 6-]-decane (TCD-diamine); 1,4-diamino-2,2,6-trimethylcyclohexane (TMCDA); 1,8-menthanediamine; 3,9-bis(3-aminopropyl)-2,4,8,10-tetraoxaspiro[5.5] undecane; and, 1,3-bis(aminomethyl)benzene (MXDA).

b) Tertiary amine group-containing polyamines with two or three primary aliphatic amine groups of which the following specific examples may be mentioned: N,N'-bis(aminopropyl)-piperazine; N,N-bis(3-aminopropyl) methylamine; N,N-bis(3-aminopropyl)ethylamine; N,N-bis(3-aminopropyl)propylamine; N,N-bis(3-aminopropyl)cyclohexylamine; N,N-bis(3-aminopropyl)-2-ethyl-hexylamine; tris(2-aminoethyl)amine; tris(2-aminopropyl)amine; tis(3-aminopropyl)amine; and, the products from the double cyanoethylation and subsequent reduction of fatty amines derived from natural fatty acids, such as N,N-bis(3-aminopropyl)dodecylamine and N,N-bis(3-aminopropyl)tallow alkylamine, commercially available as Triameen Y12D and Triameen YT (from Akzo Nobel).

c) Ether group-containing aliphatic primary polyamines of which the following specific examples may be mentioned: bis(2-aminoethyl)ether; 3,6-dioxaoctane-1, 8-diamine; 4,7-dioxadecane-1,10-diamine; 4,7-dioxadecane-2,9-diamine; 4,9-dioxadodecane-1,12-diamine; 5,8-dioxadodecane-3,10-diamine; 4,7,10-trioxatridecane-1,13-diamine and higher oligomers of these diamines; bis(3-aminopropyl)polytetrahydrofuranes and other polytetrahydrofuran diamines; cycloaliphatic ether group-containing diamines obtained from the propoxylation and subsequent amination of 1,4-dimethylolcyclohexane, such as that material commercially available as Jeffamine® RFD-270 (from Huntsman); polyoxyalkylenedi- or -triamines obtainable as products from the amination of polyoxyalkylenedi- and -triols and which are commercially available under the name of Jeffamine® (from Huntsman), under the name of polyetheramine (from BASF) or under the name of PC Amines® (from Nitroil). A particular preference may be noted for the use of Jeffamine® D-230, Jeffamine® D-400, Jeffamine® D-600, Jeffamine® D-2000, Jeffamine® D-4000, Jeffamine® T-403, Jeffamine® T-3000, Jeffamine® T-5000, Jeffamine® EDR-104, Jeffamine® EDR-148 and Jeffamine® EDR-176, as well as corresponding amines from BASF or Nitroil.

d) Primary diamines with secondary amine groups of which the following examples may be mentioned: 3-(2-aminoethyl)aminopropylamine, bis(hexamethylene)triamine (BHMT); diethylenetriamine (DETA); triethylenetetramine (TETA); tetraethylenepentamine (TEPA); pentaethylenehexamine (PEHA); higher homologs of linear polyethyleneamines, such as polyethylene polyamines with 5 to 7 ethyleneamine units (so-called “higher ethylenepolyamine,” HEPA); products from the multiple cyanoethylation or cyanobutylation and subsequent hydrogenation of primary di- and polyamines with at least two primary amine groups, such as dipropylenetriamine (DPTA), N-(2-aminoethyl)-1,3-propanediamine (N3-amine), N,N'-bis(3-aminopropyl)ethylenediamine (N4-amine), N,N'-bis(3-aminopropyl)-1,4-diaminobutane, N5-(3-aminopropyl)-2-methyl-1,5-pentanediamine, N3-(3-aminopentyl)-1,3-pentanediamine, N5-(3-amino-1-ethylpropyl)-2-methyl-1,5-pentanediamine or N,N'-bis(3-amino-1-ethylpropyl)-2-methyl-1,5-pentanediamine.

e) Polyamines with one primary and at least one secondary amino group of which the following examples may be mentioned: N-butyl-1,2-ethanediamine; N-hexyl-1,2-ethanediamine; N-(2-ethylhexyl)-1,2-ethanediamine; N-cyclohexyl-1,2-ethanediamine; 4-aminomethyl-piperidine; N-(2-aminoethyl)piperazine; N-methyl-1,3-propanediamine; N-butyl-1,3-propanediamine; N-(2-ethylhexyl)-1,3-propanediamine; N-cyclohexyl-1,3-propanediamine; 3-methylamino-1-pentylamine; 3-ethylamino-1-pentylamine; 3-cyclohexylamino-1-pentylamine; fatty diamines such as N-cocoalkyl-1,3-propanediamine; products from the Michael-type addition reaction of primary aliphatic diamines with acrylonitrile, maleic or fumaric acid diesters, citraconic acid diesters, acrylic and methacrylic acid esters, acrylic and methacrylic acid amides and itaconic acid diesters, reacted in a 1:1 molar ratio; products from the partial reductive alkylation of primary polyamines with aldehydes or ketones, especially N-monoalkylation products of the previously mentioned polyamines with two primary amine groups and in particular of 1,6-hexanediamine, 1,5-diamino-2-methylpentane, 1,3-bis(aminomethyl)cyclohexane, 1,4-bis(aminomethyl)cyclohexane, 1,3-bis(aminomethyl)benzene, BHMT, DETA, TETA, TEPA, DPTA, N3-amine and N4-amine, wherein preferred alkyl groups are benzyl, isobutyl, hexyl and 2-ethylhexyl; and, partially styrenated polyamines such as those commercially available as Gaskamine® 240 (from Mitsubishi Gas Chemical).

f) Secondary diamines and, in particular, N,N'-dialkylation products of the previously mentioned polyamines with two primary amine groups, especially N,N'-dialkylation products of 1,6-hexanediamine, 1,5-diamino-2-methylpentane, 1,3-bis(aminomethyl)cyclohexane, 1,4-bis(aminomethyl)-cyclohexane, 1,3-bis(aminomethyl)benzene, BHMT, DETA, TETA, TEPA, DPTA, N3-amine or N4-amine, wherein preferred alkyl groups are 2-phenylethyl, benzyl, isobutyl, hexyl and 2-ethylhexyl.

g) Aromatic polyamines of which mention may be made of m- and p-phenylenediamine; 4,4'-, 2,4' and 2,2'-diaminodiphenylmethane; 3,3'-dichloro-4,4'-diaminodiphenylmethane (MOCA); 2,4- and 2,6-tolylenediamine; mixtures of 3,5-dimethylthio-2,4- and -2,6-tolylenediamine (available as Ethacure® 300 from Albemarle); mixtures of 3,5-diethyl-2,4- and -2,6-tolylene diamine (DETDA); 3,3',5,5'-tetraethyl-4,4'-diaminodiphenylmethane (M-DEA); 3,3',5,5'-tetraethyl-2,2'-dichloro-4,4'-diaminodiphenylmethane (M-CDEA); 3,3'-diisopropyl-5,5'-dimethyl-4,4'-diaminodiphenylmethane (M-MIPA); 3,3',5,5'-tetraisopropyl-4,4'-diaminodiphenylmethane (M-DIPA); 4,4'-diamino diphenyl-sulfone (DDS); 4-amino-N-(4-aminophenyl)benzenesulfonamide; 5,5'-methylenedianthranilic acid; dimethyl-(5,5'-methylenedianthranilate); 1,3-propylene-bis(4-aminobenzoate); 1,4-butylene-bis(4-aminobenzoate); polytetramethylene oxide-bis(4-aminobenzoate) (available as Versalink® from Air Products); 1,2-bis(2-aminophenylthio)ethane, 2-methylpropyl-(4-chloro-3,5-diaminobenzoate); and, tert.butyl-(4-chloro-3,5-diaminobenzoate).

h) Polyamidoamines of which indicative members include the reaction products of monohydric or polyhydric carboxylic acids or the esters or anhydrides thereof,—in particular dimer fatty acids—and an aliphatic, cycloaliphatic or aromatic polyamine, for instance polyalkyleneamines such as DETA or TETA. Commercially available polyamidoamines include: Versamid® 100, 125, 140 and 150 (from Cognis); Aradur® 223, 250 and 848 (from Huntsman); Euretek®3607 and 530 (from Huntsman); and, Beckopox® EH 651, EH 654, EH 655, EH 661 and EH 663 (from Cytec).

Preferred among the aforementioned polyamines having at least two primary aliphatic amine groups are: isophorone diamine (IPDA); hexamethylene diamine (HMDA); 1,3-bis(amino-methyl)cyclohexane; 1,4-bis(aminomethyl)cyclohexane; bis(4-amino-cyclohexyl)methane; bis(4-amino-3-methylcyclohexyl)methane; NBDA; and, ether group-containing polyamines with a number average molecular weight (Mn) of up to 500 g/mol. Particularly preferred among said ether group-containing polyamines are Jeffamine® D-230 and D-600 (available from Huntsman).

The use of imidazole and derivatives thereof is also envisaged. As exemplary imidazole derivatives mentioned may be made of: 2-methylimidazole; 1-methylimidazole; 2-ethyl-4-methylimidazole; 2-ethyl-5-methylimidazole; 2-heptadecylimidazole; 2-phenylimidazole; 2-phenyl-4,5-dihydroxymethylimidazole; 2-phenyl-4-methyl-5-hydroxymethylimidazole; 2-phenyl-4-benzyl-5-hydroxymethyl-imidazole; and, 1-(2-cyanoethyl)-2-ethyl-4(5)-methylimidazole. Commercially available imidazoles are sold by Shikoku under the name CUREZOL.

It is further considered that modified amines may be used as curatives herein. Such modified amines include but are not limited to: epoxy-amine adducts obtained by the reaction of an epoxy compound with a stoichiometric excess of a polyamine (epoxy-amine adducts are available as Ajicure MY series (eg Ajicure MY-25, Ajicure MY-24 Ajicure MY-H from Ajinomoto); and epoxy imidazole adducts such as those described in U.S. Pat. No. 3,375,695 (Klaren et al.) and those commercially available as EPIKURE® P-100 and P-101 from Hexion or as Ajicure PN series (eg Ajicure PN-50, Ajicure PN-31, Ajicure PN-H, Ajicure PN-23) from Ajinomoto.

As noted above, the composition of the present invention may optionally comprise at least one compound which has at least two reactive mercapto-groups per molecule. Suitable mercapto-group containing compounds, which may be used alone or in combination, include but are not limited to the following.

- Liquid mercaptan-terminated polysulfide polymers of which commercial examples include: Thiokol® polymers (available from Morton Thiokol), in particular the types LP-3, LP-33, LP-980, LP-23, LP-55, LP-56, LP-12, LP-31, LP-32 and LP-2 thereof; and, Thioplast® polymers (from Akzo Nobel), in particular the types G10, G112, G131, G1, G12, G21, G22 and G44.
- Mercaptan-terminated polyoxyalkylene ethers, obtainable by reacting polyoxyalkylenedi- and -triols either with epichlorohydrin or with an alkylene oxide, followed by sodium hydrogen sulfide.
- Mercaptan-terminated compounds in the form of polyoxyalkylene derivatives, known under the trade name of Capcure® (from Cognis), in particular the types WR-8, LOF and 3-800 thereof.
- Polyesters of thiocarboxylic acids of which particular examples include: pentaerythritol tetramercapto-acetate (PETMP); trimethylolpropane trimercaptoacetate (TMPMP); glycol dimercaptoacetate; and, the esterification products of polyoxyalkylene diols and triols, ethoxylated trimethylolpropane and polyester diols with thiocarboxylic acids such as thioglycolic acid and 2- or 3-mercaptopropionic acid.
- 2,4,6-trimercapto-1,3,5-triazine, 2,2'-(ethylenedioxy)-diethanethiol (triethylene glycol dimercaptan) and/or ethanedithiol.

A preference for the use of polyesters of thiocarboxylic acids and, in particular, for the use of at least one of pentaerythritol tetramercapto-acetate (PETMP), trimethylolpropane trimercaptoacetate (TMPMP) and glycol dimercaptoacetate is acknowledged.

As noted above, the curative b) may comprise at least one Mannich base. Such compounds may be characterized by containing at least one phenalkamine and, in particular, a phenalkamine obtained from the condensation of cardanol (CAS Number: 37330-39-5), an aldehyde and an amine. The reactant amine in the condensation reaction is desirably ethylenediamine or diethyltriamine.

Mannich bases and phenalkamines are known in the art and suitable examples include the commercially available phenalkamines Cardolite® NC-541, NC-557, NC-558, NC-566, Lite 2001 and Lite 2002 (available from Cardolite), Aradur® 3440, 3441, 3442 and 3460 (available from Huntsman) and Beckopox® EH 614, EH 621, EH 624, EH 628 and EH 629 (available from Cytec).

In highly preferred embodiment imidazoles, imidazole-epoxy adducts, and amine-epoxy adduct are used a curative.

These exemplary curatives provide ideal balance between profile, cure speed, adhesion and electrical properties. For example, dicyanoamide based curatives are not considered to be used in the invention according to the present invention because they are prone to result higher volume resistivity.

The composition of the present invention typically comprises from 0.5 to 10 wt. %, based on the weight of the composition, of curative b). Preferably the composition comprises from 0.5 to 7.5 wt. %, for example from 1 to 6 wt. % or from 1 to 5 wt. % of said curative b) based on the weight of the composition.

In an alternative expression of the composition of the present invention, which is not intended to be mutually exclusive of the compositional (wt. %) ranges for part a) or part b) given above, it is preferred that the composition in toto is characterized by a molar ratio of epoxy-reactive groups to epoxy groups from 1:0.95 to 1:5, for example from 1:0.95 to 1:4. And, for completeness, the total of epoxy reactive groups includes latent reactive groups present in the composition. Notably, the molar ratio of epoxy-reactive groups to epoxy groups of 1:1 is included within these stated ranges and itself represents a highly preferred molar ratio.

c) Electrically Conductive Particles

The composition of the present invention comprises electrically conductive particles. The composition may, for instance, contain from 55 to 80 wt. % or from 60 to 80 wt. % of electrically conductive particles, based on the weight of the composition. In certain important embodiments, the electrically conductive particles should be included in the composition in an amount of from 60 to 76 wt. %, based on the total weight of the composition. Preferably the composition comprises from 67 to 75 wt. % of electrically conductive particles, based on the total weight of the composition.

Where the quantity of the electrically conductive particles is below 55 wt. %, based on the weight of the composition, the composition might not provide the desired electrical conductivity. Conversely, where the quantity of the electrically conductive filler is above 80 wt. %, based on the weight of the composition, the composition may no longer be cost effective and may possess a deleterious overall weight. In addition, quantity higher than 80 wt. %, based on the weight of the composition increases the viscosity of the composition which leads to difficulties on application when typical industrial processes are used, processes such as high-speed printing and dispensing. Further, quantity higher than 80 wt. %, based on the weight of the composition results a higher storage modulus, and this additional stiffness is detrimental for reliability performance of the composition.

Broadly, there is no particular intention to limit the shape of the particles employed as electrically conductive fillers: particles that are acicular, spherical, ellipsoidal, cylindrical, bead-like, cubic or platelet-like may be used alone or in combination. The electrically conductive filler may be for example a mixture of spherical particles and flake particles. Moreover, it is envisaged that agglomerates of more than one particle type may be used.

Equally, there is no particular intention to limit the size of the particles employed as conductive fillers. However, such electrically conductive particles will conventionally have an average volume particle size, as measured by laser diffraction/scattering methods, of from 300 nm to 50 μm, for example from 500 nm to 40 μm or from 500 nm to 30 μm. In the aforementioned measurement method, the particle size is measured by particle size analyser and the particle shape is analysed by scanning electron microscope. In short, scattered laser lights from the particles are detected an array of detectors. Theoretical calculation is carried out to fit the measured distribution of scattered light intensity. During the fitting process the particle size distribution is deduced and inter alia D10, D50 and D90 values are calculated accordingly.

For surety, it is noted that suitable electrically conductive particles for use in the present invention may be a mixture of particles having a small particle size and particles having a larger particle size.

In an independent characterization of the particles, which may or may not compliment the aforementioned particle size distribution, it is preferred that the electrically conductive particles have a tap density from 0.5 to 6.0 g/cm$^3$, preferably from 0.5 to 5.5 g/cm$^3$ and more preferably from 0.5 to 5.0 g/cm$^3$ as determined in accordance to ISO 3953 using a 25 cm$^3$ graduated glass cylinder. The principle of the method specified is tapping a specified amount of powder in a container by means of a tapping apparatus until no further decrease in the volume of the powder takes place. The mass of the powder divided by its volume after the test gives its tap density.

Suitable electrically conductive particles are selected from the group consisting of: silver; nickel; carbon; carbon black; graphite; graphene; copper; gold; platinum; aluminium; iron; zinc; cobalt; lead; tin alloys; silver coated nickel; silver coated copper; silver coated graphite; silver coated polymers, for example silver coated acrylic polymers and/or silver coated silicone based polymers; silver coated aluminium; silver coated glass; silver coated carbon; silver coated boron nitride; silver coated aluminium oxide; silver coated aluminium hydroxide; nickel coated graphite; and, mixtures thereof.

Preferably electrically conductive filler is selected from the group consisting of: silver; carbon black; graphite; graphene; copper; silver coated nickel; silver coated copper; silver coated graphite; silver coated polymers; silver coated aluminium; silver coated glass; silver coated carbon; silver coated boron nitride; silver coated aluminium oxide; silver coated aluminium hydroxide; nickel coated graphite; and, mixtures thereof.

More preferably, the electrically conductive particles are selected from the group consisting of: silver, silver coated copper; silver coated graphite; silver coated polymers; silver coated aluminium; silver coated glass; and, mixtures thereof. Silver is particularly preferred because of its good electrical performance. Conversely, silver coated particles might gain preference because of their lower cost as compared to silver per se. However, in such silver coated or silver plated particles, the silver coating or plating should substantially and preferably wholly coat the underlying particulate material. Alternatively, or additional to that requirement, the quantity of silver in the silver coated particle should preferably be from 10 to 70 wt. %, for example from 10 to 65 or 60 wt. % based on the total weight of the electrically conductive particles.

By way of illustration only, suitable commercially available electrically conductive particles for use in the present invention include, but are not limited to: AA3462, AA-5124, AA-192N, C-1284P, C-0083P, EA3105, P888-6 and P543-14 silver particles, available from Metalor; KP84, KP74, KP29, SF7 AT, SF15 ED, SF40, SF78, SF98, SF102 and SF134 silver particles, available from Ames Goldsmidth; silver particles, available from Ames Goldsmidth; CGF-DAB-121B silver coated copper particles, available from Dowa; AgCu0810 or AgCu0305 silver coated copper particles, available from Ames Goldsmidth; CONDUCT-O-FIL™ SG15F35 silver coated glass, available from Potters Industries Inc.; the silver coated polymer Spherica™ Ag-30-01, Spherica™ Ag-20-01, Spherica™ Ag-10-01 and Spherica™ Ag-4-01 available from Conpart AS; silver coated graphite available as P594-5 from Metalor; and, silver coated aluminium available as CONDUCT-O-FIL™ SA325S20 from Potters Industries Inc.

d) Core-Shell Rubber

The composition of the present invention comprises core-shell rubber particles. The composition may, for instance, contain from 0.1 to 5.0 wt. % or from 0.1 to 4.5 wt. % of core-shell rubber particles, based on the weight of the composition. In certain important embodiments, the core-shell rubber particles should be included in the composition in an amount of from 0.2 to 4.5 wt. %, for example from 0.3 to 4.0 wt. %, based on the total weight of the composition.

The term "core shell rubber" or CSR is being employed in accordance with its standard meaning in the art as denoting a rubber particle core formed by a polymer comprising an elastomeric or rubbery polymer as a main ingredient and a shell layer formed by a polymer which is graft polymerized onto the core. The shell layer partially or entirely covers the surface of the rubber particle core in the graft polymerization process. By weight, the core should constitute at least 50 wt. %, for instance from 50 to 95 wt. %, of the core-shell rubber particle.

The polymeric material of the core should have a glass transition temperature ($T_g$) of no greater than 0° C. and preferably a glass transition temperature ($T_g$) of −20° C. or lower, more preferably −40° C. or lower and even more preferably −60° C. or lower. The polymer of the shell is non-elastomeric, thermoplastic or thermoset polymer having a glass transition temperature ($T_g$) of greater than room temperature, preferably greater than 30° C. and more preferably greater than 50° C.

For completeness, it is considered that the core shell rubber particles may be comprised of more than two layers. For instance, a central core of a first rubbery material may be surrounded by a second core of a second, different rubbery material. Alternatively, a single core may be surrounded by at least two shells of different composition and different glass transition temperature or hardness. In an illustrative embodiment, the core shell rubber particles used are comprised of a single core and at least two concentric shells having different chemical compositions and/or properties.

Without intention to limit the invention, the core may be comprised of: a diene homopolymer, for example, a homopolymer of butadiene or isoprene; a diene copolymer, for example a copolymer of butadiene or isoprene with one or more ethylenically unsaturated monomers, such as vinyl aromatic monomers, (meth)acrylonitrile or (meth)acrylates; polymers based on (meth)acrylic acid ester monomers, such as polybutylacrylate; and, polysiloxane elastomers such as polydimethylsiloxane and crosslinked polydimethylsiloxane.

Similarly without intention to limit the present invention, the shell may be comprised of a polymer or copolymer of one or more monomers selected from: (meth)acrylates, such as methyl methacrylate; vinyl aromatic monomers, such as styrene; vinyl cyanides, such as acrylonitrile; unsaturated acids and anhydrides, such as acrylic acid; and, (meth) acrylamides. The polymer or copolymer used in the shell may possess acid groups that are cross-linked ionically through metal carboxylate formation, in particular through forming salts of divalent metal cations. The shell polymer or copolymer may also be covalently cross-linked by monomers having two or more double bonds per molecule. Further, the polymer or co-polymer constituting the shell may bear one or more different types of functional groups— herein epoxy groups for example—that are capable of interacting with other components of the composition of the present invention.

It is preferred that any included core-shell rubber particles have an average particle size (d50) of from 10 nm to 1000 nm, for example from 50 nm to 500 nm or from 50 to 400 nm: said particle size refers to the diameter or largest dimension of a particle in a distribution of particles and is measured via dynamic light scattering. For completeness, the present application does not preclude the presence of two or more types of core shell rubber (CSR) particles with different particle size distributions in the composition to provide a balance of key properties of the resultant cured product, including shear strength, peel strength and resin fracture toughness.

Methods of preparing core shell rubber particles as defined herein above have been documented in the art. Representative references which might be mentioned include: U.S. Pat. Nos. 4,419,496; 4,778,851; 5,981,659; 6,111,015; 6,147,142; and, 6,180,693. Using such methods, the rubber particles having a core-shell structure may be prepared as a masterbatch wherein the rubber particles are dispersed: in one or more resins; in an aqueous medium; or, in an aqueous emulsion. Such dispersions or emulsions may be combined with the desired resin(s) and any water or other volatile substances removed by distillation or the like.

The core-shell rubber may be selected from commercially available products, examples of which include: Paraloid EXL 2650A, EXL 2655 and EXL2691 A, available from The Dow Chemical Company; Clearstrength XT100, available from Arkema Inc.; the Kane Ace™ MX series available from Kaneka Corporation, and in particular MX-120, MX-125, MX-130, MX-135, MX-136, MX-551, MX-553; ALBIDUR® EP 940 available from Evonik; and, METABLEN SX-006 available from Mitsubishi Rayon.

e) i) Monofunctional Epoxy Reactive Diluent

The composition of the present invention may comprise a monofunctional epoxy reactive diluent, which reactive diluent is distinct from the first epoxy resin and, when present, the second epoxy resin included in the composition as component (a). As used herein, the term "monofunctional epoxy reactive diluent" refers to a liquid which bears one reactive epoxy functional group and which is added to a material or compound—for example the first epoxy resin(s)—to form a composition of reduced viscosity. Herein, the reactive diluent permits the epoxy resin(s) to accept a higher solid loading. The monoepoxy reactive diluent is desirably characterized by a viscosity between 0.005 and 0.75 Pa·s at 25° C., for example a viscosity of less than 0.6 Pa·s or less than 0.5 Pa·s as determined at 25° C.

Viscosity of monofunctional epoxy reactive diluent is measured at 25° C. on a Rheometer from TA Instruments Rheometer HR-1 or Q-2000 using a 2 degrees cone-plate geometry with a 2 cm in diameter plate and shear rates of 15 $s^{-1}$. Viscosity units are reported in Pa·s.

When present, the composition should comprise from 1 to 7 wt. %, based on the weight of the composition, of said monofunctional epoxy reactive diluent, preferably from 2 to 6 wt. % and more preferably from 3 to 5 wt. %.

Without intention to limit the present invention, illustrative monofunctional epoxy reactive diluents include: alkylene oxides; epoxy-substituted cycloaliphatic hydrocarbons, such as cyclohexene oxide, cyclooctene oxide, cyclododecene oxide, vinylcyclohexene monoxide, (+)-cis-limonene oxide, (+)-cis,trans-limonene oxide, (−)-cis,trans-limonene oxide, and α-pinene oxide; epoxy-substituted aromatic hydrocarbons; monoepoxy substituted alkyl ethers of monohydric alcohols or phenols, such as the glycidyl ethers of aliphatic, cycloaliphatic and aromatic alcohols; monoepoxy-substituted alkyl esters of monocarboxylic acids, such as glycidyl esters of aliphatic, cycloaliphatic and aromatic monocarboxylic acids, such as the glycidyl ester of Versatic® acid; monoepoxy-substituted alkyl esters of polycarboxylic acids wherein the other carboxy group(s) are esterified with alkanols; alkyl and alkenyl esters of epoxy-substituted monocarboxylic acids; epoxyalkyl ethers of polyhydric alcohols wherein the other OH group(s) are esterified or etherified with carboxylic acids or alcohols; and, monoesters of polyhydric alcohols and epoxy monocarboxylic acids, wherein the other OH group(s) are esterified or etherified with carboxylic acids or alcohols.

By way of example, the following glycidyl ethers might be mentioned as being particularly suitable monoepoxy reactive diluents for use herein: methyl glycidyl ether; ethyl glycidyl ether; propyl glycidyl ether; butyl glycidyl ether; pentyl glycidyl ether; hexyl glycidyl ether; cyclohexyl glycidyl ether; octyl glycidyl ether; 2-ethylhexyl glycidyl ether; allyl glycidyl ether; benzyl glycidyl ether; phenyl glycidyl ether; 4-tert-butylphenyl glycidyl ether; 1-naphthyl glycidyl ether; 2-naphthyl glycidyl ether; 2-chlorophenyl glycidyl ether; 4-chlorophenyl glycidyl ether; 4-bromophenyl glycidyl ether; 2,4,6-trichlorophenyl glycidyl ether; 2,4,6-tribromophenyl glycidyl ether; pentafluorophenyl glycidyl ether; o-cresyl glycidyl ether; m-cresyl glycidyl ether; and, p-cresyl glycidyl ether. A preference for aliphatic monoglycidyl ethers containing $C_{4-14}$ alkyl chains might be noted.

In an embodiment, the monoepoxy reactive diluent conforms to Formula (1) herein below:

(I)

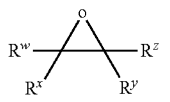

wherein: $R^w$, $R^x$, $R^y$ and $R^z$ may be the same or different and are independently selected from hydrogen, a halogen atom, a $C_1$-$C_{28}$ alkyl group, a $C_3$ to $C_{10}$ cycloalkyl group, a $C_2$-$C_{12}$ alkenyl, a $C_6$-$C_{18}$ aryl group or a $C_7$-$C_{18}$ aralkyl group, with the proviso that at least one of $R^y$ and $R^z$ is not hydrogen.

It is preferred that $R^w$, $R^x$ and $R^y$ are hydrogen and $R^z$ is either a phenyl group or a $C_1$-$C_{20}$ alkyl group and, more preferably, a $C_1$-$C_{18}$ alkyl group. For example, $R^z$ may be $C_4$ to $C_{18}$ or a $C_8$-$C_{16}$ alkyl group.

Having regard to this embodiment, exemplary monoepoxides include: ethylene oxide; 1,2-propylene oxide (propylene oxide); 1,2-butylene oxide; cis-2,3-epoxybutane; trans-2,3-epoxybutane; 1,2-epoxypentane; 1,2-epoxyhexane; 1,2-1,2-epoxyheptane; 1,2-epoxydecane; 1,2-epoxydodecane; 1,2-epoxytetradecane; 1,2-epoxyhexadecane; 1,2-epoxyoctadecane; 1,2-epoxyeicosane; butadiene oxide; isoprene oxide (3,4-Epoxy-2-methyl-1-butene); and, styrene oxide (phenylethylene oxide). Exemplary commercial monofunctional epoxy reactive diluents for use herein include the Vikolox® series of 1,2-epoxyalkanes available from Arkema, in particular Vikolox®10, Vikolox®12, Vikolox®14, Vikolox®16, Vikolox®18, Vikolox®20, Vikolox®11-14, Vikolox®15-18, Vikolox®20-24 and Vikolox®24-28.

The above aside, the composition can in certain embodiments comprise glycidoxy alkyl alkoxy silanes having the formula:

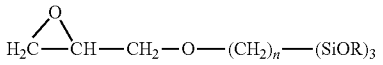

wherein: each R is independently selected from methyl or ethyl; and, n is from 1-10.

Exemplary silanes include but are not limited to: γ-glycidoxy propyl trimethoxy silane, γ-glycidoxy ethyl trimethoxy silane, γ-glycidoxy methyl trimethoxy silane, γ-glycidoxy methyl triethoxy silane, γ-glycidoxy ethyl triethoxy silane, γ-glycidoxy propyl triethoxy silane; and, 8-glycidooxyoctyl trimethoxysilane. When present, the epoxy functional silanes should constitute less than less than 10 wt. %, preferably less than 5 wt. % or less than 2 wt. %, based on the total weight of the epoxy compounds in the composition.

e) ii) Polyfunctional Epoxy Reactive Diluent

The composition of the present invention may comprise a polyfunctional epoxy reactive diluent, which reactive diluent is distinct from the first epoxy resin and, when present, the second epoxy resin included in the composition as component (a). As used herein, the term "polyfunctional epoxy reactive diluent" refers to a liquid which bears two or more reactive epoxy functional group and which is added to a material or compound—for example the first epoxy resin(s)—to form a composition of reduced viscosity. Herein, the reactive diluent permits the epoxy resin(s) to accept a higher solid loading. The polyfunctional epoxy reactive diluent is desirably characterized by a viscosity between 0.050 and 0.750 Pa·s at 25° C., for example a viscosity of less than 0.600 Pa·s or less than 0.500 Pa·s as determined at 25° C.

Viscosity of polyfunctional epoxy reactive diluent is measured at 25'C on a Rheometer from TA Instruments Rheometer HR-1 or Q-2000 using a 2 degrees cone-plate geometry with a 2 cm in diameter plate and shear rates of 15 $s^{-1}$. Viscosity units are reported in Pa·s.

When present, the composition should comprise from 2 to 8 wt. %, based on the weight of the composition, of said polyfunctional epoxy reactive diluent, preferably from 3 to 7 wt. % and more preferably from 4 to 6 wt. %.

Without intention to limit the present invention, illustrative polyfunctional epoxy reactive diluents include: diglycidyl ethers of an aliphatic glycol such as 1,4 butanediol diglycidyl ether (BDDGE), 1,6 hexanediol diglycidyl ether (HDDGE), neopentyl glycol diglycidyl ether and the diglycidyl ether of 1,4-cyclohexanedimethanol; polyalkyleneglycol based diglycidyl ethers, in particular polypropyleneglycol diglycidyl ethers; diglycidyl ethers of bisphenol-A epichlorohydrin based epoxy resins; diglycidyl ethers of bisphenol-A polyether based epoxy adducts; and, polycarbonatediol based glycidyl ethers. Other suitable diepoxies which might also be mentioned include: diepoxies of double unsaturated fatty acid $C_1$-$C_{18}$ alkyl esters; dimer acid diglycidyl esters; vinylcyclohexene diepoxy; and, limonene diepoxy.

Exemplary commercial polyfunctional epoxy reactive diluents for use herein include: HELOXY® Modifiers 32, 67, 68, HD and 107, available from Momentive Specialty Chemicals, Inc; and, DER 732 P available from Olin, Epiclon EXA-4850 available from DIC, Erisys GE 30, GE 31, GE 35, GE 36, GE 38, GE 40 and Erisys GS 110 from Huntsman.

Additives and Adjunct Ingredients

Said compositions obtained in the present invention will typically further comprise adjuvants and additives that can impart improved properties to these compositions. Included among such adjuvants and additives are: plasticizers; stabilizers including UV stabilizers; non-epoxy cyclic co-monomers; non-epoxy functional flexibilizers; tougheners other than core-shell rubber particles; adhesion promoters; conductivity promoters; anti-corrosion agents; anti-bleed agents; rheological adjuvants such as particulate silica, modified silica, alumina and/or modified alumina; wetting agents; surfactants; antioxidants; radical scavengers; drying agents; fungicides; flame retardants; colour pigments or colour pastes; and/or optionally also, to a small extent, non-reactive diluents (solvents).

In one embodiment, the composition according to the present invention comprises a conductivity promoter. Preferably, said conductivity promoter for use in the present invention is selected from OH-functionalized diacids such as oxalic acid, malonic acid, succinic acid, glutaric acid, adipic acid, pimelic acid, suberic acid, azelaic acid, sebacic acid, undecanedioic acid, dodecanedioic acid and OH-functionalized quinolines, such as 2-hydrozyquinoline, 4-hydrozyquinoline, 6-hydrozyquinoline, 8-hydrozyquinoline and mixtures thereof.

Such adjuvants and additives can be used in such combination and proportions as desired, provided they do not adversely affect the nature and essential properties of the composition. While exceptions may exist in some cases, these adjuvants and additives should not in toto comprise more than 20 wt. % of the total composition and preferably should not comprise more than 15 wt. % or more than 10 wt. % of the composition.

The present invention also does not preclude the curable compositions from further comprising one or more cyclic monomers selected from the group consisting of: oxetanes; cyclic carbonates; cyclic anhydrides; and, lactones. The disclosures of the following citations may be instructive in disclosing suitable cyclic carbonate functional compounds: U.S. Pat. Nos. 3,535,342; 4,835,289; 4,892,954; UK Patent No. GB-A-1,485,925; and, EP-A-0 119 840. However, such cyclic co-monomers should constitute less than 10 wt. %, preferably less than 7.5 wt. % or less than 5 wt. %, based on the total weight of the epoxy compounds.

As noted above, the compositions of the present invention may include a non-epoxy functional flexibilizer to moderate one or both of the viscosity of the uncured resin and the cross-link density of the cured resin and so impart desirable mechanical properties to that cured composition, such as flexibility and thermal shock resistance especially when such compositions can experience temperature excursions below −40° C. When so included for these purposes, said flexibilizers should not exceed 25 wt. % based on the weight of part a) of the composition.

As suitable flexibilizers mention may be made of: polyol compounds bearing long aliphatic groups, such as ε-caprolactone triol available as TONE 0301, 0305, 0310 from Union Carbide Corporation; phenoxy functional modifiers; polysulfones, such as those available under the product names UDEL and RADEL from BP-Amoco Chemical; polyetherimides, such as those available under the product name ULTEM from General Electric Plastics; polyamide-imides; poly(arylene ethers); polyesters; polyarylates; polycarbonates; and, polyurethanes. Conventionally, the molecular weight (Mn) of these flexibilizers should range from 400 to 20,000 Daltons, preferably from 500 to 5000 Daltons.

A "plasticizer" for the purposes of this invention is a substance that decreases the viscosity of the composition and thus facilitates its processability. Herein the plasticizer may constitute up to 10 wt. % or up to 5 wt. %, based on the total weight of the composition, and is preferably selected from the group consisting of: diurethanes; ethers of monofunctional, linear or branched $C_4$-$C_{16}$ alcohols, such as Cetiol OE (obtainable from Cognis Deutschland GmbH, Düsseldorf); esters of abietic acid, butyric acid, thiobutyric acid, acetic acid, propionic acid esters and citric acid; esters based on nitrocellulose and polyvinyl acetate; fatty acid esters; dicarboxylic acid esters; esters of OH-group-carrying fatty acids; glycolic acid esters; benzoic acid esters; phosphoric acid esters; sulfonic acid esters; trimellitic acid esters; polyether plasticizers, such as end-capped polyethylene or polypropylene glycols; polystyrene; hydrocarbon plasticizers; chlorinated paraffin; and, mixtures thereof. It is noted that, in principle, phthalic acid esters can be used as the plasticizer, but these are not preferred due to their toxicological potential.

"Stabilizers" for purposes of this invention are to be understood as antioxidants, UV stabilizers, thermal stabilizers or hydrolysis stabilizers. Herein stabilizers may constitute in toto up to 10 wt. % or up to 5 wt. %, based on the total weight of the composition. Standard commercial examples of stabilizers suitable for use herein include: sterically hindered phenols; thioethers; benzotriazoles; benzophenones; benzoates; cyanoacrylates; acrylates; amines of the hindered amine light stabilizer (HALS) type; phosphorus; sulfur; and, mixtures thereof.

The presence of non-CSR tougheners in an amount up to 5 wt. %, based on the weight of the composition, can further enhance the durability of the curable composition. In this context, elastomer-containing adducts may be used individually or a combination of two or more particular adducts might be used. Moreover, each adduct may independently be selected from solid adducts or liquid adducts at room temperature. Typically, useful adducts will be characterized by a ratio by weight of epoxy to elastomer of from 1:5 to 5:1, for example from 1:3 to 3:1. And an instructive reference regarding suitable epoxy/elastomer adducts is US Patent Publication 2004/0204551. Moreover, exemplary commercial epoxy/elastomer adducts for use herein include but are not limited to: HYPDX RK8-4 commercially available from CVC Chemical; and, B-Tough A3 available from Croda Europe Limited.

An adhesion promoter may be added to the composition to improve the adhesion of the epoxy resin to a substrate. Adhesion promoters may function by forming a new layer at the interface which binds strongly to both the substrate and the adhesive composition. The resultant interfacial region may also be more resistant to chemical attack from the environment.

The selection of adhesion promoter may be determined by the type of surface to which the composition will be applied. That said, the most common commercial adhesion promoters are organosilanes of which certain epoxy functional organosilanes types have been mentioned hereinbefore. Further types of adhesion promoter which may find utility herein include: organometallic compounds such as titanates and zirconates, of which specific examples include isopropyl tri(N-ethylaminoethylamino)titanate, tetraisopropyl di(dioctylphosphito)titanate, neoalkoxytrisneodecanoyl zirconate and zirconium propionate; dihydric phenolic compounds such as catechol and thiodiphenol; hydroxyl amines such as tris(hydroxymethyl) aminomethane; polyhydric phenols such as pyrogallol, gallic acid, or tannic acid; and, plastisols, which are suspensions of polyvinyl chloride particles in a plasticizer.

As will be recognized by the skilled artisan, the amount of rheological adjuvants, reactive diluents and non-reactive diluents in the composition is determinative of the viscosity of the electrically conductive composition and can thus be moderated dependent upon the selected method of application of the composition. The viscosity tolerated for stencil or screen printing may, for instance, be slightly higher than the viscosity needed in a dispensing method. That aside, if the viscosity of the composition is too high—for instance the viscosity at 25° C. is above 100 Pa·s as measured by rheometer at 15 $s^{-1}$—the application of the electrically conductive adhesive composition in any high speed process will become problematic.

In one embodiment the present invention is directed to an electrically conductive composition comprising:

- a) a resin component comprising
  - 1) a first epoxy resin; and
  - 2) a second epoxy resin and/or a functionalised polybutadiene resin and/or a functionalised butadiene-acrylonitrile copolymer;
- b) a curative for epoxy resin;
- c) an electrically conductive filler;
- d) a core shell rubber toughener; and,
- e) a reactive diluent component comprising
  - 1) a monofunctional epoxy reactive diluent and/or
  - 2) a polyfunctional epoxy reactive diluent;

wherein said composition further comprises a curing agent if said functionalised polybutadiene resin is present in said resin component.

In another embodiment the present invention is directed to an electrically conductive composition comprising:

- a) a resin component consisting of
  - 1) a first epoxy resin; and
  - 2) a second epoxy resin and/or a functionalised polybutadiene resin and/or a functionalised butadiene-acrylonitrile copolymer;
- b) a curative for epoxy resin;
- c) an electrically conductive filler;
- d) a core shell rubber toughener; and,
- e) a reactive diluent component comprising
  - 1) a monofunctional epoxy reactive diluent and/or
  - 2) a polyfunctional epoxy reactive diluent;

wherein said composition further comprises a curing agent if said functionalised polybutadiene resin is present in said resin component.

Methods and Applications

To form a composition, the above described parts are brought together and mixed. As is conventional in the art, to form one component (1K) curable compositions, the elements of the composition are brought together and homogeneously mixed. As such, it will often be preferred that the curative elements are not mixed by hand but are instead mixed by machine—a static or dynamic mixer, for example—in pre-determined amounts under anhydrous conditions without intentional heating or photo-irradiation.

In accordance with the broadest process aspects of the present invention, the above described compositions are applied to a substrate and then cured in situ. Prior to applying the compositions, it is often advisable to pre-treat the relevant surfaces to remove foreign matter there from: this step can, if applicable, facilitate the subsequent adhesion of the compositions thereto. Such treatments are known in the art and can be performed in a single or multi-stage manner constituted by, for instance, the use of one or more of: an etching treatment with an acid suitable for the substrate and optionally an oxidizing agent; sonication; plasma treatment, including chemical plasma treatment, corona treatment, atmospheric plasma treatment and flame plasma treatment; immersion in a waterborne alkaline degreasing bath; treatment with a waterborne cleaning emulsion; treatment with a cleaning solvent, such as carbon tetrachloride or trichloroethylene; and, water rinsing, preferably with de-ionized or de-mineralized water. In those instances where a waterborne alkaline degreasing bath is used, any of the degreasing agent remaining on the surface should desirably be removed by rinsing the substrate surface with de-ionized or de-mineralized water.

In some embodiments, the adhesion of the compositions of the present invention to the substrate may be facilitated by the application of a primer thereto. In some embodiments, the substrate may be pre-treated. Whilst the skilled artisan will be able to select an appropriate primer, instructive references for the choice of primer include but are not limited to: U.S. Pat. Nos. 3,671,483; 4,681,636; 4,749,741; 4,147,685; and, U.S. Pat. No. 6,231,990.

The electrically conductive compositions are then applied to the optionally primed surfaces of the substrate by conventional application methods such as: contact dispensing, including time/pressure dispensing (TPD), semi-positive displacement dispensing and true-positive displacement dispensing; non-contact jet dispensing; non-contact dynamic drop dispensing; and, printing methods. A preference may be noted for the application of the compositions by printing and, in particular, by screen or stencil printing.

It is recommended that the compositions be applied to a surface at a wet thickness of from 10 to 3000 μm, for example from 20 to 2000 μm or from 30 to 1000 μm or 30 to 500 μm or 35 to 250 μm. The application of thinner features within this range is more economical and provides for a reduced likelihood of deleterious thick cured regions. However, great control must be exercised in applying thinner coatings so as to avoid the formation of discontinuous cured films or linear features.

The curing of the applied compositions of the invention typically occurs at temperatures in the range of from 30° C. to 200° C., preferably from 30° C. to 180° C., and in particular from 40° C. to 160° C. The temperature that is suitable depends on the specific compounds present and the desired curing rate and can be determined in the individual case by the skilled artisan, using simple preliminary tests if necessary. Of course, curing at lower temperatures within the aforementioned ranges is advantageous as it obviates the requirement to substantially heat or cool the mixture from the usually prevailing ambient temperature. Where applicable, however, the temperature of the mixture formed from the respective elements of the composition may be raised above the mixing temperature and/or the application temperature using conventional means including microwave induction.

In an embodiment, the electrically conductive adhesive composition as defined hereinabove may be applied to at least one of a solar cell or an electrically conductive ribbon (5), said ribbon (5) and said cell are contacted, optionally under pressure, and the electrically conductive composition is cured. By this process, an electrically conductive ribbon may be used to connect two or more solar cells, thereby forming a solar module.

In an embodiment, the present invention provides a method of making a shingled solar module, which method comprises: i) assembling a plurality of rectangular silicon solar cells arranged in line with end portions on long sides of adjacent rectangular silicon solar cells overlapping in a shingled manner; and, ii) at least partially curing an electrically conductive adhesive composition as defined herein above, which composition is disposed between the overlapping end portions of adjacent rectangular silicon solar cells, thereby bonding adjacent overlapping rectangular silicon solar cells to each other and electrically connecting them in series. The step of curing may be effected by the application of heat and, optionally, pressure to the overlapping rectangular silicon solar cells.

The plurality of rectangular silicon solar cells provided in step i) of the above embodiment may be obtained from a so-called super cell. Scribe lines, which define the plurality of rectangular cells, are created on the super cell using a laser and the cells are then separated along those scribe lines. Whilst the cells may be separated by cutting or dicing, in a further illustrative separation process, vacuum is applied between the bottom surfaces of the super cell and a curved supporting surface to flex the super cell against the curved supporting surface and thereby cleave the one or more silicon solar cells along the scribe lines. It is considered that the electrically conductive adhesive might be applied to the super cell in regions adjacent to the scribe lines prior to the separation of the individual silicon cells.

As noted in step ii) of this method, it may be feasible to form an intermediate structure through only partial curing the electrically conductive composition. However, where the module is so-formed by partially curing the adhesive composition, the method will comprise the step of completing the curing of the electrically conductive bonding material, thought the application of heat and, optionally, pressure to intermediate structure.

The following examples are illustrative of the present invention and are not intended to limit the scope of the invention in any way.

EXAMPLES

The following materials and abbreviations for said materials were employed in the Examples:

Epo Tohto ZX 1059: Hydrogen 4-cyclohexene-1,2-dicarboxylate2,2'-[methylenebis(2,6-diethyl-4,1-phenylene)]bis[2,3-dihydro-1,3-dioxo-1H-isoindole-5-carboxylate], CAS No. 385801-30-9, available from Tohto Kasei Co., Ltd.

Epiclon N730A: Polyfunctional, phenol novolac based epoxy resin available from DIC Corporation.

Ricon 130 MA20: Maleic anhydride grafted polybutadiene, available from Total.

Conductivity promoter: OH-functionalized conductivity promoter from Sigma Aldrich.

Dicumyl peroxide: Bis(1-methyl-1-phenylethyl) peroxide, available from Sigma Aldrich.

BHT: 2,6-di-tert-butyl-4-methylphenol, available from Sigma Aldrich.

U1MM-S: Imidazole adduct, available from Henkel.

Loctite LN-2: Amine-epoxy adduct available from Brenntag.

Dynasylan® Glymo: 3-glycidyloxypropyltrimethoxysilane having an epoxy equivalent weight of 236 g/eq, available from Evonik Resource Efficiency GmbH.

DER 732 P: Liquid Epoxy Resin, reaction product of epichlorohydrnn and polypropylene glycol, available from Olin.

Vikolox 14: Epoxidized α-olefin ($C_{14}H_{28}O$), available from Arkema.

Cardura E10P: Epoxidized aliphatic ester, available from Hexion.

Flex 1: Epoxidized aliphatic dimer acid, available from Henkel.

KaneAce MXN35: Core-shell rubber particles, available from Kaneka Corporation.

Silver particles: Silver particles, available from Ames Goldsmith, Metalor, or Dowa. Particle size is below 30 microns, tap density is between 3 and 5 g/$cm^3$ and specific surface are is between 0.2 and 1.0 $m^2$/g.

The Formulations described in Table herein below were prepared by homogenizing the stated ingredients using a centrifuge or propeller or double planetary mixer. The formulations were then stored in a freezer at −40'C.

TABLE 1

| Ingredient | Example 1 | Example 2 | Comparative Example 3 | Comparative Example 4 |
|---|---|---|---|---|
| Epotohto ZX 1059 | 7.08 | 13.98 | 19.18 | 15.70 |
| Epiclon N730A | | 0.80 | | |
| Ricon 130MA20 | 9.93 | | | |
| Conductivity promoter | | 1.91 | 1.78 | 1.91 |
| Dicumyl peroxide | 0.34 | | | |
| BHT | 0.03 | | | |
| U1MM-S | 1.52 | 1.76 | 1.93 | 1.75 |
| Loctite LN-2 | 1.52 | 1.76 | 1.93 | 1.75 |
| Glymo | 0.20 | 0.22 | 0.22 | 0.22 |
| DER 732 P | | 5.00 | | |
| Vikolox 14 | 4.12 | | | |
| Cardura E10P | | | 1.29 | |
| Flex 1 | | | | 5.00 |
| Kane Ace MX135 | 3.03 | 0.90 | | |
| Silver Particles | 72.24 | 73.67 | 73.68 | 73.68 |

The following Test Methods were employed in the Examples:

i) Viscosity:

This was measured at 25° C. on a Rheometer from TA Instruments Rheometer HR-1 or Q-2000 using a plate-plate geometry with a 2 cm in diameter plate at a 200 micron gap and shear rates of 15 $s^{-1}$. Viscosity units are reported in Pa·s.

ii) Volume resistivity (VR) was measured as follows:

Samples were prepared for the compositions according to the examples above and deposited on a glass plate (by drawing down a strip of material onto the surface of a glass slide with strip dimensions of about 5 cm in length, 5 mm in width and about 50 micron in thickness) and cured and dried (according to the requirement for the used resin). Glass plates were cooled to room temperature, before measurement. Volume resistivity was calculated from equation VR=(width of the sample (cm)×thickness of the sample (cm)×Resistance (Ohm))/length of the sample (cm). Where the resistance in ohm was measured by using a Keithley 2010 multimeter and a 4-point resistance probe. Volume resistivity units are reported in Ohm·cm iii) Electrical Contact Resistance (CR)

Figure 4:
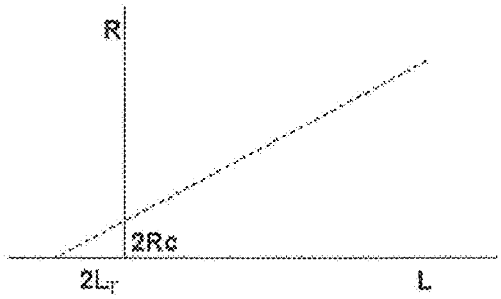
FIG. 4 illustrates a diagram of electrical contact resistance.

The electrical contact resistance was determined by dispensing the conductive adhesive in a transmission line method (TLM) structure on a 1.0 mm wide busbar of a c-Si wafer. A TLM structure was obtained by contacting 10 Ag plated Cu ribbon (1.2 mm wide) to the test layer, wherein the distance between adjacent contact tabs is about 13 mm. The resistance between the neighbouring contact tabs and between the first and the n+1 (where n represents the ordinal number after the first) tabs was measured by using Keithley four-point probes and a Keithley 2750 multimeter and plotted as a function of the distance. The contact resistance value is the half of the intercept from the curve obtained from that plot. The average contact resistance (arithmetic average) is reported in mohm. If no linear relation could be found because of bad ohmic contacts meaning a rsq value of less than 0.95, "no fit" was mentioned. (See FIG. 4.)

The stability of the electrical contact resistance was determined by accelerated ageing testing (85° C., relative humidity of 85% and −40, 85° C. thermal cycling) using the TLM test setup as described above.

Thermal cycling (TC) between −40° C. and 85° C. was performed according to IEC 61215 10.11 for at least 200 cycles. Damp Heat (DH) Testing for at least 2000 Hours was performed according to IEC 61215 10.13.

iv) DSC has been measured by using Dynamic Scanning Calorimetry Q2000 from TA Instruments. The basic principle underlying this technique is that when the sample undergoes a phase transitions, more or less heat will be needed compared to the reference to keep the reference and the sample at the same temperature. Whether less or more heat must flow to the sample depends on whether the process is exothermic or endothermic. Weight of the analysed uncured material in the sample pan is 5 to 20 mg. A hermetic aluminium sample pan is used, and sample is subjected to dynamic heating where sample is heated from room temperature to 250° C. at 10° C./min heating rate under continuous nitrogen flow of 50 mL/min. This allows to follow the cure behaviour which is an exothermic reaction. Peak temperature of the exothermic reaction is reported in ° C.

v) Storage Modulus (MPa) and Glass Transition Temperature (Tg)

Dynamic mechanical analysis (DMA) is performed to measure the Storage Modulus (E-modulus) value which is the elastic response of material by using TA instruments DMA Q800. Storage Modulus units are reported in MPa.

Glass transition temperature (Tg) of epoxy resin—which had been cured and dried according to the requirements of the resin used—was determined by the tan delta of the DMA scan.

Thin film samples with the following dimensions: width 5 mm, length 13-15 mm and thickness 150-200 micron, were measured by using Film Tension clamp. Samples were cured for 15 min at 150° C. in a box oven and placed into the Film Tension clamp of the DMA in which samples were pre-heated to 85° C. for 10 min before ramping at 10° C./min to −60° C. and up to 200° C. Both Tg as well as E-modulus were determined during the last heating step.

vi) Coefficient of Thermal Expansion (CTE)

The coefficient of thermal expansion was measured by Thermomechanical Analysis (TMA) using a TA Instruments Q400 equipment, in accordance with ASTM E831 Standard TestMethodfornearThermalExpansion of Solid Materials by Thermomechanical Analysis. Epoxy resin—which had been cured and dried according to the requirements of the resin used—was cut in 4×4×1 mm The results of the performance of the above described tests on the curable formulations of Examples 1 and 2 are documented in Table 2 herein below.

TABLE 2

| Test | Example 1 | Example 2 | Comparative Example 3 | Comparative Example 4 |
|---|---|---|---|---|
| Viscosity at 15 s−1 (Pa · s) | 52 | 37 | 70 | 29 |
| Volume resistivity (Ohm · cm) | $1.8 \cdot 10^{-4}$ | $4.4 \cdot 10^{-4}$ | $4.0 \cdot 10^{-4}$ | $3.4 \cdot 10^{-4}$ |
| DSC peak (° C.) | 138 | 133 | 130 | 133 |
| Initial CR (mOhm) | 7.1 | 6.9 | 7.7 | 6.6 |
| CR after TC 1000 Cycles (mOhm) | 7.2 | 14.3 | 8.6 | 7.1 |
| CR after DH 2000 Hours (mOhm) | 0.04 | 0.04 | 0.04 | NA |

TABLE 2-continued

| Test | Example 1 | Example 2 | Comparative Example 3 | Comparative Example 4 |
|---|---|---|---|---|
| Tg (° C.) | 96 | 98 | 130 | 107 |
| $E_{mod}$ at Room Temperature (MPa) | 3200 | 4450 | 5710 | 4300 |
| $\Delta CTE_{Tg}$ (ppm/° C.) | 29 | 16 | 84 | 60 |

The combination of mechanical and electrical properties of the ECA is critical and determine the module performance in reliability tests. Firstly, low electrical resistivity within the bulk of the ECA as well as low contact resistivity between the ECA and the cell busbar surfaces are needed to maximize module electrical power output. Moreover, the ECA must be flexible enough to cope with the mechanical stresses associated with the standard tests, and the differences of coefficient of thermal expansion (CTE) and Tg should be low in order to avoid causing additional stresses to the bond line during thermal cycling. For example, very rigid materials would perform well in thermal cycling tests, but they are typically not able to release stresses related to weight and pressure and cells bonded with such materials are more prone to crack under load. Conversely, more flexible materials can dissipate the mechanical stress much better, but they typically lack enough stability during thermal cycling tests. Additional method to evaluate the module performance is to measure power Loss (%), after mechanical load test (MLT, performed according to IEC 61215 16.1), which references the actual standard for photovoltaic module product qualification in simulating the combined wind, snow and dust load by the means of a static load (Pa). Next to static mechanical load test, the current invention is also desirable for having a low power loss after dynamic mechanical load such as described for example under IEC TS 62782:2016 or IEEE1262 or IEC 61215:2016.

As such, ECA parameters like VR, CR, Tg, Emod at room temperature and $\Delta CTE_{Tg}$ are of critical importance for the present invention. In this context, the compositions according to the present invention provide low bulk and contact resistivity in combination with low enough Emod at room temperature and low $\Delta CTE_{Tg}$. The good mechanical and electrical properties of the compositions according to the present invention lead inevitable to low power loss values. It is indicated that the compositions according to the present invention have power loss less than 7%.

In view of the foregoing description and examples, it will be apparent to those skilled in the art that equivalent modifications thereof can be made without departing from the scope of the claims.

What is claimed is:

1. An electrically conductive composition comprising:

a) a resin component comprising

1) A first epoxy resin selected from the group consisting of aliphatic epoxy resin, cycloaliphatic epoxy resin, epoxy novolac resin, bisphenol-A-epoxy resin, bisphenol-F-epoxy resin, hydrogenated bisphenol-A-epoxy resin, hydrogenated bisphenol-F-epoxy resin, bisphenol-A epichlorohydrin based epoxy resin, polyepoxies, propylene glycol epoxy resin, reaction products of polyether-polyol with epichlorohydrin, epoxy silicone co-polymers and mixtures thereof, said first epoxy resin being present in amounts of from 4 to 17% by weight of the total composition; and 2) a second epoxy resin selected from the group consisting of epichlorohydrin formaldehyde phenol resin, epichlorohydrin phenol novolac resin, epichlorohydrin o-cresol novolac resin, epichlorohydrin m-xylenediamine resin, epichlorohydrin diamino diphenyl methane resin, epichlorohydrin trimethylol propane resin and mixtures thereof, said second epoxy resin being present in amounts of 0.3 to 3% by weight of the total weight of the composition; and/or a functionalised polybutadiene resin present in amounts of 0.1 to 15% by weight of the total weight of the composition, and/or a functionalised butadiene-acrylonitrile copolymer resin present in amounts of 0.1 to 5% by weight of the total weight of the composition and mixtures thereof any of the above;

b) an electrically conductive filler;

c) a curative for epoxy resin;

d) a core shell rubber toughener present in amounts of 0.3 to 4.0% by weight of the total composition; and e) a reactive diluent component comprising 1) A monofunctional epoxy reactive diluent and/or 2) a polyfunctional epoxy reactive diluent;

wherein said composition further comprises a curing agent if said functionalized polybutadiene resin is present in said resin component; wherein said composition is in the absence of a cyanate ester; and wherein the glass transition temperature (Tg) is 96-98° C. and the $\Delta CTE_{Tg}$ is 16-29 ppm/° C. as measured by thermochemical analysis in accordance with ASTM E831 after thermal cycling between −40 C and 85 C for at least 200 cycles according to IEC 61315 10.11.

2. An electrically conductive composition according to claim 1, wherein said functionalised polybutadiene resin is present in amounts of 0.1 to 15% by weight of the total weight of the composition and is selected from the group consisting of maleic anhydride functionalised polybutadiene, vinyl functionalised polybutadiene, maleic anhydride grafted vinyl functionalised polybutadiene, epoxidized polybutadiene and mixtures thereof, and wherein said functionalised butadiene-acrylonitrile copolymer, when present, is selected from the group consisting of epoxy-modified butadiene-acrylonitrile copolymer, carboxyl-modified butadiene-acrylonitrile copolymer, amine-modified butadiene-acrylonitrile copolymer, alcohol-modified butadiene-acrylonitrile copolymer and mixtures thereof.

3. An electrically conductive composition according to claim 1, wherein said curative is an amine-based curative or a nitrogen containing epoxy adduct.

4. An electrically conductive composition according to claim 1, wherein said electrically conductive filler is selected from the group consisting of: silver; nickel; carbon; carbon black; graphite; graphene; copper; gold; platinum; aluminium; iron; zinc; cobalt; lead; tin alloys; silver coated nickel; silver coated copper; silver coated graphite; silver coated polymers; silver coated aluminium; silver coated glass; silver coated carbon; silver coated boron nitride; silver coated aluminium oxide; silver coated aluminium hydroxide; nickel coated graphite; and mixtures thereof; and wherein said electrically conductive filler is present in amounts from 55 to 80% by weight of the total weight of the composition.

5. An electrically conductive composition according to claim 1, wherein said core shell rubber toughener is selected from the group consisting of rubber-modified bisphenol-A-epoxy resin, rubber-modified bisphenol-F-epoxy resin, rubber-modified butadiene-acrylonitrile copolymer, rubber modified acrylonitrile and mixtures thereof.

6. An electrically conductive composition according to claim 1, wherein said monofunctional epoxy reactive diluent is selected from the group consisting of an aliphatic monoglycidyl ether containing C4-14 alkyl chains, aromatic monoglycidyl ether containing a benzene ring, epoxidized alpha olefin having C8-C16 linear alkyl chain, epoxidized alpha olefin having C8-C16 branched alkyl chain and mixtures thereof.

7. An electrically conductive composition according to claim 1, wherein said polyfunctional epoxy reactive diluent is selected from the group consisting of 1,4-bis(2,3-epoxypropyloxy) butane, epoxypropoxypropyl terminated dimer acid, epoxypropoxypropyl terminated polydimethylsiloxane, polyglycol chain diepoxy and mixtures thereof; and wherein said polyfunctional epoxy reactive diluent is present from 2 to 8% by weight of the total weight of the composition.

8. An electrically conductive composition according to claim 1, wherein said curing agent is an organic peroxide selected from the group consisting of dicumyl peroxide, tert-amyl peroxypivalate, tert-amyl peroxy-2-ethylhexanoate, tertiary-butylperoxy 2-ethylhexanoate, 1,1-di-(tert-amylperoxy) cyclohexane, 1,1-di-(tert-butylperoxy) cyclohexane, tert-butyl peroxy-3,5,5-trimethylhexanoate, tert-butyl peroxyacetate, tert-butyl peroxybenzoate, ethyl-3,3-di-(tert-amylperoxy) butyrate, di-tert butyl peroxide, di-tert amyl peroxide, tert-butyl hydroperoxide and mixtures thereof; and is present in amounts from 0.05 to 2% by weight of the total weight of the composition.

9. A cured product of the electrically conductive composition according to claim 1.

10. A photovoltaic module comprising a series-connected string of two or more solar cells in a shingle pattern having an electrically conductive bonding between said two or more solar cells, wherein said electrically conductive bonding is formed with an electrically conductive composition according to claim 1.

11. A photovoltaic module according to claim 10, wherein said electrically conductive composition is applied by dispensing, jetting or printing.

12. An electrically conductive composition comprising:

a) a resin component consisting of

1) A first epoxy resin selected from the group consisting of aliphatic epoxy resin, cycloaliphatic epoxy resin, epoxy novolac resin, bisphenol-A-epoxy resin, bisphenol-F-epoxy resin, hydrogenated bisphenol-A-epoxy resin, hydrogenated bisphenol-F-epoxy resin, bisphenol-A epichlorohydrin based epoxy resin, polyepoxies, propylene glycol epoxy resin, reaction products of polyether-polyol with epichlorohydrin, epoxy silicone co-polymers and mixtures thereof, said first epoxy resin being present in amounts of from 4 to 17% by weight of the total composition; and 2) a second epoxy resin selected from the group consisting of epichlorohydrin formaldehyde phenol resin, epichlorohydrin phenol novolac resin, epichlorohydrin o-cresol novolac resin, epichlorohydrin m-xylenediamine resin, epichlorohydrin diamino diphenyl methane resin, epichlorohydrin trimethylol propane resin and mixtures thereof, said second epoxy resin being present in amounts of 0.3 to 3% by weight of the total weight of the composition; and/or a functionalised polybutadiene resin present in amounts of 0.1 to 15% by weight of the total weight of the composition, and/or a functionalised butadiene-acrylonitrile copolymer resin present in amounts of 0.1 to 5% by weight of the total weight of the composition and mixtures thereof any of the above;

b) an electrically conductive filler;

c) a curative for epoxy resin;

d) a core shell rubber toughener present in amounts of 0.3 to 4.0% by weight of the total composition; and e) a reactive diluent component consisting of 1) A monofunctional epoxy reactive diluent and/or 2) a polyfunctional epoxy reactive diluent;

wherein said composition may optionally include a curing agent if said functionalized polybutadiene resin is present in said resin component, wherein said composition may optionally include plasticizers; stabilizers; UV stabilizers; non-epoxy cyclic co-monomers; non-epoxy functional flexibilizers; tougheners other than core-shell rubber particles; adhesion promoters; conductivity promoters; anti-corrosion agents; anti-bleed agents; rheological adjuvants; particulate silica; modified silica; alumina; modified alumina; wetting agents; surfactants; anti-oxidants; radical scavengers; drying agents; fungicides; flame retardants; colour pigments; colour pastes; non-reactive solvents; or combinations thereof, and wherein the glass transition temperature (Tg) is 96-98° C. and the $\Delta CTE_{Tg}$ is 16-29 ppm/° C. as measured by thermochemical analysis in accordance with ASTM E831 after thermal cycling between −40 C and 85 C for at least 200 cycles according to IEC 61315 10.11.

13. An electrically conductive composition according to claim 1, wherein said second epoxy resin is epichlorohydrin phenol novolac resin.

14. An electrically conductive composition according to claim 12, wherein said second epoxy resin is epichlorohydrin phenol novolac resin.

15. An electrically conductive composition comprising:

a) a resin component comprising

1) A first epoxy resin selected from the group consisting of aliphatic epoxy resin, cycloaliphatic epoxy resin, epoxy novolac resin, bisphenol-A-epoxy resin, bisphenol-F-epoxy resin, hydrogenated bisphenol-A-epoxy resin, hydrogenated bisphenol-F-epoxy resin, bisphenol-A epichlorohydrin based epoxy resin, polyepoxies, propylene glycol epoxy resin, reaction products of polyether-polyol with epichlorohydrin, epoxy silicone co-polymers and mixtures thereof, said first epoxy resin being present in amounts of from 4 to 17% by weight of the total composition; and 2) a second epoxy resin selected from the group consisting of epichlorohydrin formaldehyde phenol resin, epichlorohydrin phenol novolac resin, epichlorohydrin o-cresol novolac resin, epichlorohydrin m-xylenediamine resin, epichlorohydrin diamino diphenyl methane resin, epichlorohydrin trimethylol propane resin and mixtures thereof, said second epoxy resin being present in amounts of 0.3 to 3% by weight of the total weight of the composition; and a functionalised polybutadiene resin present in amounts of 0.1 to 15% by weight of the total weight of the composition, and optionally a functionalised butadiene-acrylonitrile copolymer resin present in amounts of 0.1 to 5% by weight of the total weight of the composition and mixtures thereof any of the above;

b) an electrically conductive filler;

c) a curative for epoxy resin;

d) a core shell rubber toughener present in amounts of 0.3 to 4.0% by weight of the total composition; and e) a reactive diluent component comprising 1) A monofunctional epoxy reactive diluent and/or 2) a polyfunctional epoxy reactive diluent;

wherein said composition further comprises a curing agent; wherein said composition is in the absence of a cyanate ester; and wherein the glass transition temperature (Tg) is 96-98° C. and the $\Delta CTE_{Tg}$ is 16-29 ppm/° C. as measured by thermochemical analysis in accordance with ASTM E831 after thermal cycling between −40 C and 85 C for at least 200 cycles according to IEC 61315 10.11.

* * * * *